(12) United States Patent  
Horie et al.

(10) Patent No.: US 7,664,309 B2
(45) Date of Patent: Feb. 16, 2010

(54) RETICLE INSPECTING APPARATUS AND RETICLE INSPECTING METHOD

(75) Inventors: Tsutomu Horie, Kunitachi (JP); Yuichi Tokumaru, Hamura (JP)

(73) Assignee: Fujitsu Microelectronics Limited, Tokyo (JP)

( * ) Notice: Subject to any disclaimer, the term of this patent is extended or adjusted under 35 U.S.C. 154(b) by 697 days.

(21) Appl. No.: 11/320,858

(22) Filed: Dec. 30, 2005

(65) Prior Publication Data

US 2006/0147104 A1 Jul. 6, 2006

(30) Foreign Application Priority Data

Jan. 5, 2005 (JP) ............................ 2005-000706
Nov. 18, 2005 (JP) ............................ 2005-334985

(51) Int. Cl.
*G06K 9/00* (2006.01)
(52) U.S. Cl. ..................................................... 382/144
(58) Field of Classification Search ................. 382/145, 382/147, 149, 151, 218, 291, 294, 144; 348/92, 348/125
See application file for complete search history.

(56) References Cited

U.S. PATENT DOCUMENTS

| | | | | |
|---|---|---|---|---|
| 5,995,199 A | * | 11/1999 | Shinozaki et al. | 355/53 |
| 6,180,289 B1 | * | 1/2001 | Hirayanagi | 430/5 |
| 2003/0143472 A1 | * | 7/2003 | Koizumi et al. | 430/5 |

* cited by examiner

*Primary Examiner*—Daniel G Mariam
(74) *Attorney, Agent, or Firm*—Westerman, Hattori, Daniels & Adrian, LLP

(57) ABSTRACT

The present invention efficiently suppresses a false defect and realizes reticle inspection where a defect can be detected with high detection sensitivity. In a reticle inspecting method, reticle inspection data generated based on reticle design data is captured. Also, drawing position accuracy measurement data of the reticle is captured to obtain a first correction amount for correcting a position accuracy component of the reticle. Based on the first correction amount, the inspection data is corrected. Based on the corrected inspection data, a defect on the reticle is detected.

20 Claims, 20 Drawing Sheets

Fig.2A
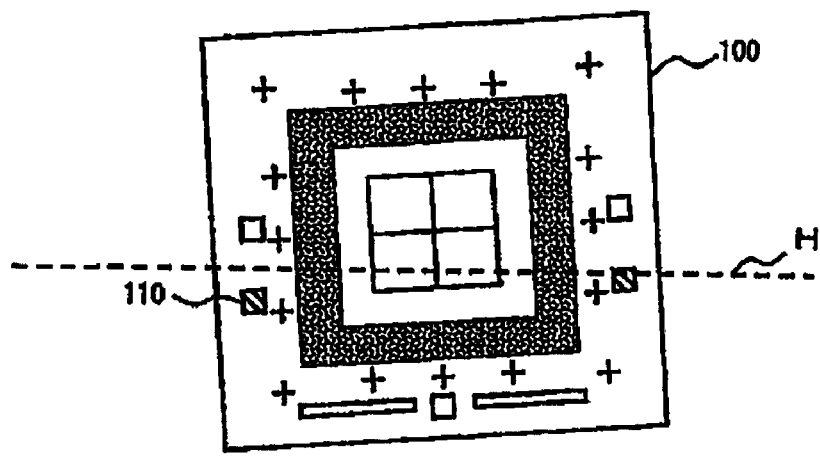
Fig.2B
ENLARGED VIEW OF THE ALIGNMENT PATTERN
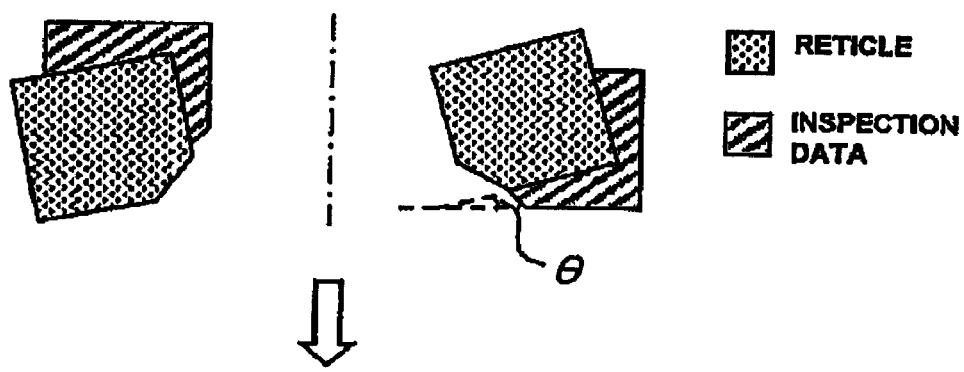
STAGE IS ROTATED SO THAT RETICLE IS BROUGHT INTO ALIGNMENT WITH INSPECTION DATA
Prior Art Prior Art Prior Art

POSITION ACCURACY MEASURING ( MEASUREMENT BY 1 NM ACCURACY )

CORRECTION 1

CORRECTION 2

FURTHER MULTIPLYING BY CORRECTION AMOUNT BASED ON ENVIRONMENT COMPONENT OBTAINED IN STEP S28

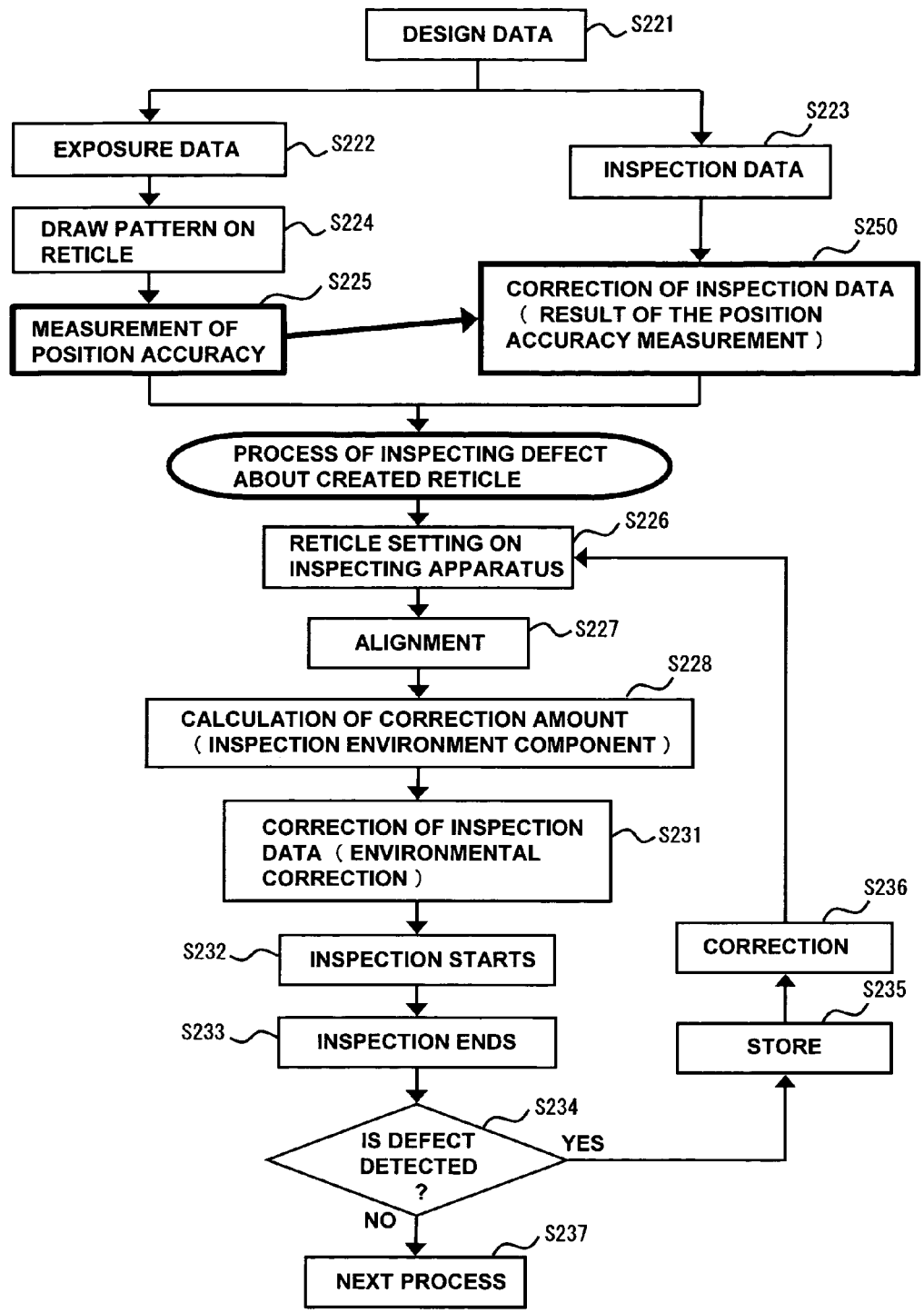

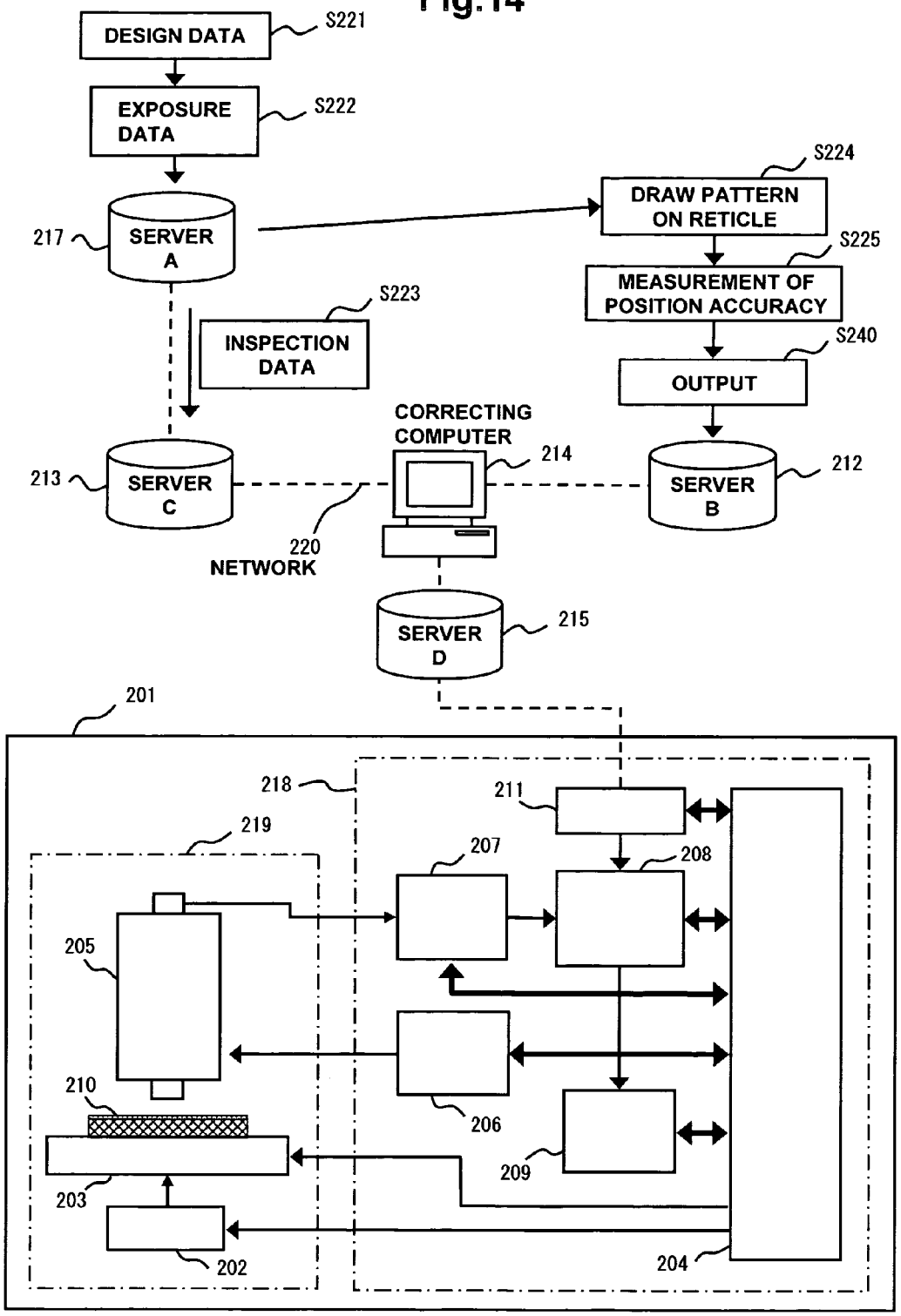

Fig.16
DESIGN DATA < D1 >
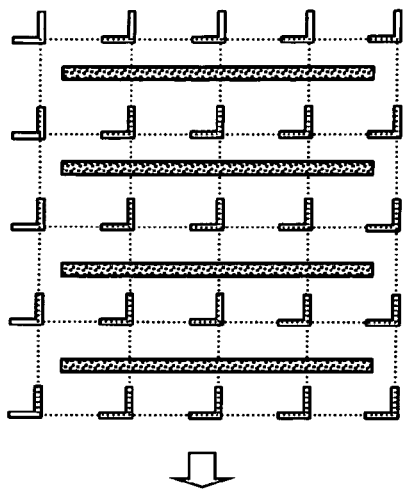
EXPOSURE DATA < D2 >
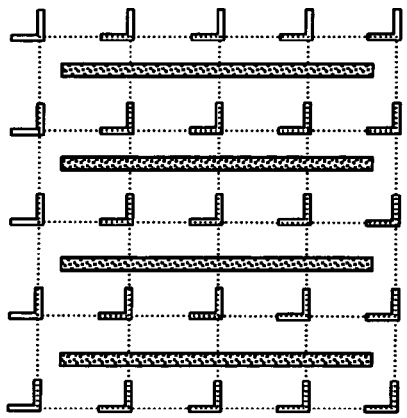
RETICLE PATTERN < D3 >
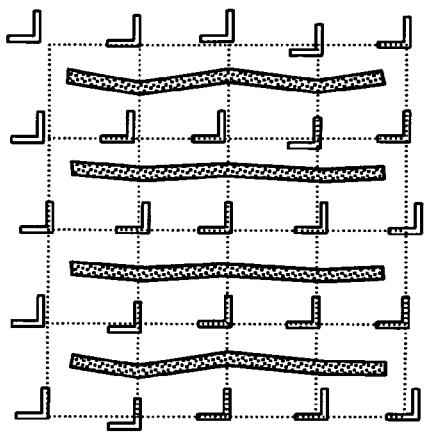
INSPECTION DATA < D4 >
( BEFORE CORRECTION )
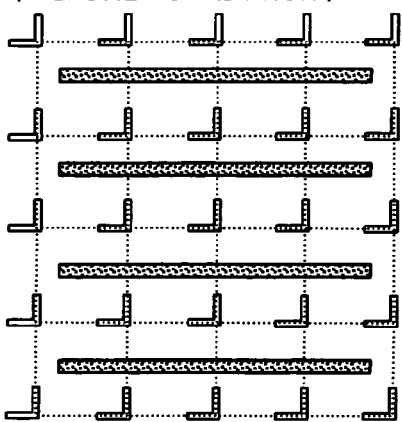

PRODUCTION LOT NUMBER : A123456N $\begin{pmatrix} \text{PRODUCTION} & \text{X} & \text{Y} \\ \text{LOT NUMBER} \, , & \text{COORDINATE} \, , & \text{COORDINATE} \end{pmatrix}$

1 , X = −0.010 , Y =   0.010

2 , X =   0.000 , Y =   0.000

3 , X =   0.000 , Y =   0.012

4 , X =   0.000 , Y = −0.008

5 , X =   0.000 , Y =   0.000

6 , X = −0.008 , Y =   0.000

7 , X = −0.006 , Y =   0.000

8 , X = −0.006 , Y =   0.000

9 , X =   0.000 , Y = −0.008

10 , X =   0.000 , Y =   0.000

11 , · · · · · · ·

Fig.20
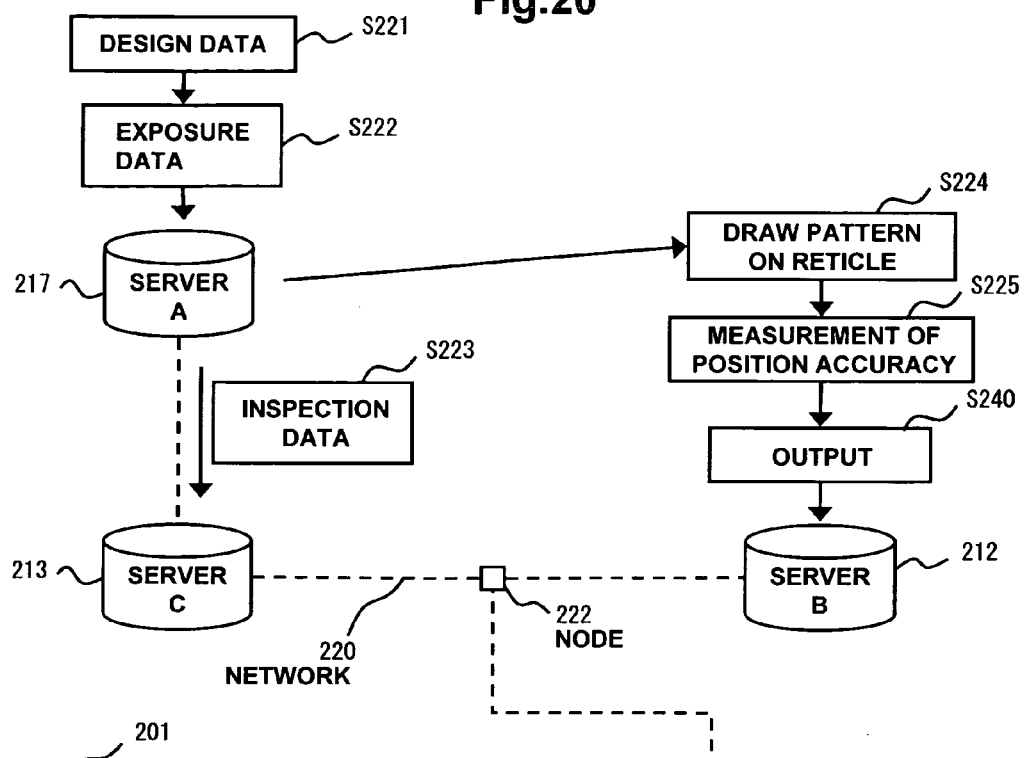
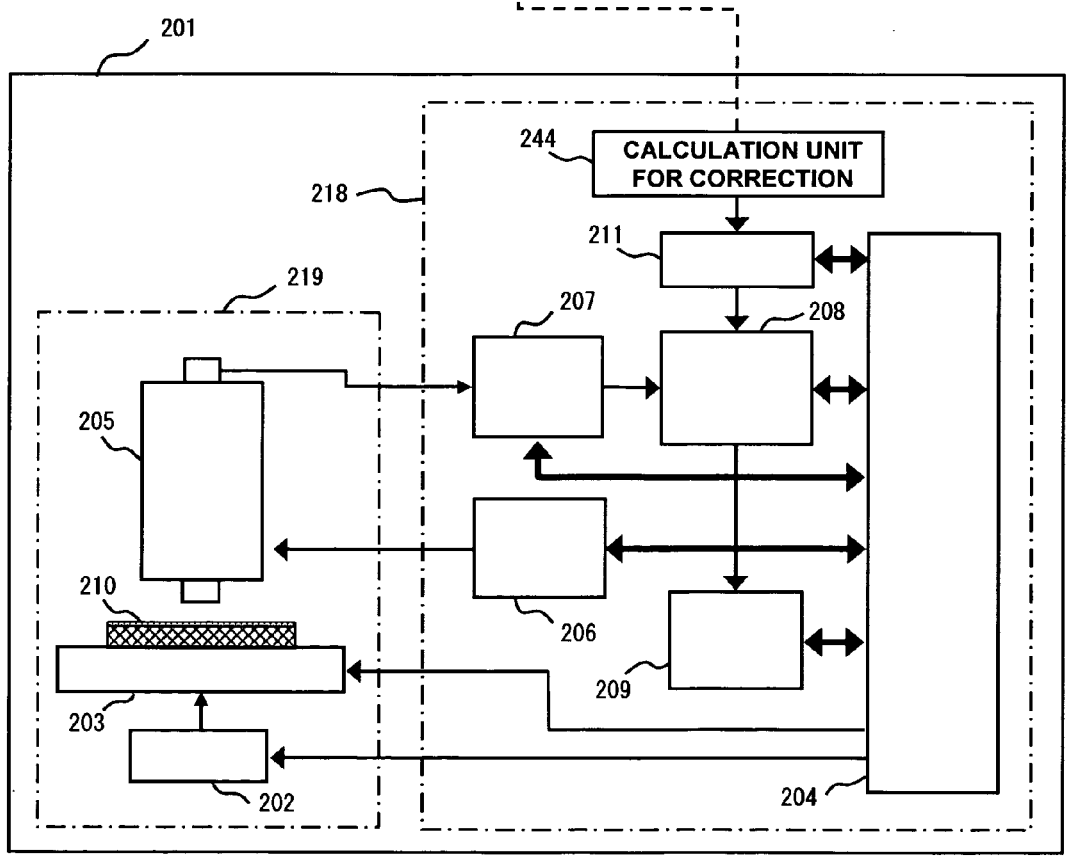

RETICLE INSPECTING APPARATUS AND RETICLE INSPECTING METHOD

BACKGROUND OF THE INVENTION

1. Field of the Invention

The present invention generally relates to a reticle inspecting technique and particularly to a reticle inspecting method and apparatus for detecting a defect on a reticle by comparing a reference image with image data that is obtained by scanning a pattern drawn on the reticle.

2. Description of the Related Art

In recent years, the packing density of electronic devices has become higher to achieve higher speed and larger capacity of a system LSI (large scale integration) and the like. Accordingly, the structure of a reticle used as an original to manufacture LSIs has become ultrafine, and thus a highly sensitive reticle inspecting apparatus is required. If a reticle has any minute defect thereon, the performance of an entire semiconductor LSI degrades. Therefore, accurately inspecting the reticle (original) is very important.

The inspecting method of the present mainstream is a data comparing inspection called "Die-to-Data Base". In "Die-to-Data Base", a defect of a circuit pattern formed on a reticle is detected by comparing actual measurement data (actual image) obtained by laser-scanning the same circuit pattern that is repeatedly formed on the retile with inspection data (reference image).

FIG. 1 is a flowchart showing a known reticle inspecting method. In this method, design data is created by a CAD (computer-aided design) or the like in a work station (S101), and the design data is converted to exposure data of a form suitable for a drawing device (S102). Also, the design data is converted to generate inspection data, which is a reference image as similar as possible to the pattern formed on an actual reticle (S103). Then, the pattern is drawn on the reticle based on the exposure data (S104). At this time, the registration accuracy of the pattern transferred onto a wafer, that is, the position accuracy of the pattern drawn on the reticle is measured so as to suppress the amount of distortion of the pattern on the wafer to a predetermined value or smaller and to ensure that the pattern is reliably stacked without problem when the pattern is transferred onto the wafer by using the reticle (S105).

In a process of inspecting a defect of the created reticle, the reticle is set on an inspecting apparatus (S106), alignment between the reticle pattern and the inspection data is performed (S107), and a correction amount is calculated (S108). Based on the calculated correction amount, the inspection data is uniformly corrected (S109).

Then, inspection starts and the corrected inspection data is compared to the reticle pattern (S110). After the inspection (S111), if a defect has been detected, defect information is stored (S113) and the residual defect on the reticle is corrected based on the defect information (S114). If no defect has been detected, the process proceeds to the next process (S115).

Assume that, as shown in FIG. 2A, a reticle 100 is set on the inspecting apparatus while being misaligned relative to a horizontal axis H in the alignment step S107. In this example, as shown in FIG. 2B, which is an enlarged view of the alignment pattern, the alignment pattern 110 on the reticle 100 is misaligned with the inspection data by an angle θ. In such a case, a stage is rotated so that the reticle is brought into alignment with the inspection data. The misalignment of the angle θ is used as correcting information to correct the inspection data.

FIGS. 3A to 3C show an example of a known uniform correction. As shown in FIGS. 3A to 3C, shrinkage ratio information of the reticle pattern is obtained at alignment. For example, FIG. 3A shows the alignment pattern and inspection data before correction. As shown in FIG. 3A, the alignment pattern drawn on the reticle is internally shrunk compared to the design data (that is, the inspection data). FIG. 3B shows an entire pattern including the above-described alignment pattern and a pattern corresponding to the circuit pattern of a device (hereinafter referred to simply as "circuit pattern"). In this case, the entire circuit pattern drawn on the reticle is internally shrunk. Then, as shown in FIG. 3C, the entire inspection data is uniformly corrected by internally shrinking it based on the shrinkage ratio information (for the entire pattern before correction shown in FIG. 3A).

As described above, in the known correcting method, a plurality of chip areas defined on the data are uniformly corrected by using the correction information (shrinkage ratio and rotation component) obtained at the alignment before inspection. In other words, the inspection data is linearly corrected by being multiplied by a predetermined correction value (x, y, and θ), and then inspection of the reticle is performed.

However, as shown in FIGS. 4A and 4B, the actual reticle includes a local misalignment and a variation in the shrinkage ratio that cannot be corrected by a uniform correction. FIG. 4A shows an ideal grid representing a chip alignment with no misalignment overlaid with a pattern formed on the actual reticle having a local misalignment amount. As shown in FIG. 4A, the pattern actually formed on the reticle includes a misalignment that can be measured by the nanometer (nm) with respect to the ideal grid (chip alignment). Actually, a nonuniform local misalignment (misalignment in position and variation in shrinkage ratio) occurs not only in each chip but also in each minute area of a matrix of the chip. Due to such a local misalignment, difference in shrinkage ratio still exists between the inspection data and the actual reticle even after the shrinkage correction has been done on the inspection data, as shown in FIG. 4B. FIG. 4B shows a state where uniform correction has been done based on the shrinkage ratio of the actual reticle, with respect to FIG. 4A showing the amount of local misalignment between the ideal grid and the actual reticle. A factor of such a misalignment includes a conventional uniform misalignment and a local misalignment. Therefore, the conventionally used uniform correcting method can cause an alignment error or a false defect. In other words, even if uniform correction is performed, inspection is performed under existence of difference from the actual reticle pattern. Thus, many alignment errors and false defects occur during the inspection. As a result, the inspection is frequently interrupted.

A method for correcting measurement data by considering expansion/shrinkage of a circuit pattern caused by deflection in the vertical direction to the principal surface of a reticle with regard to a variation component on the reticle has been suggested (e.g., see Japanese Unexamined Patent Application Publication No. 5-87544). In this method, a variation in the Z direction (height direction) of a reticle is measured by using an auto-focus function of a lens, the amount of deflection of the reticle is obtained by analysis, and the measurement data is corrected by reflecting the amount of deflection thereto.

Also, a method for preventing detection of a false defect by performing defect inspection while correcting distortion of pitches in the Y direction of a scanner during defect detection has been suggested (e.g., see Japanese Unexamined Patent Application Publication No. 2000-348177). In this method, a correcting pattern as well as a circuit pattern is drawn on a reticle, a correction table is created by measuring variation in advance pitches in the Y direction of a scan mechanism, and then an input image (scanned image) is corrected in the Y direction by referring to the correction table during inspection.

The invention described in Japanese Unexamined Patent Application Publication No. 5-87544 is directed to correcting measurement values of a line width and a distance between lines measured during inspection of a defect. More specifically, the invention described in this patent document is directed to correcting length measurement data of a pattern by measuring a variation in the height direction caused by deflection of a reticle, and does not suggest an effective solution to suppress the occurrence of a false defect caused by a nonuniform local misalignment or variation in the shrinkage ratio.

On the other hand, the invention described in Japanese Unexamined Patent Application Publication No. 2000-348177 is directed to correction about the advance accuracy (aliasing accuracy) of a scanner device, and is particularly directed to correcting a pitch distortion to realize regular pitch at inspection of a defect by measuring in advance variation in advance pitch in the Y direction of the scanner device and creating a correction table.

However, in the future highly-accurate reticle inspection, the target of the inspection is a circuit including an area of high pattern density, such as a logic circuit, and an area of low pattern density, such as an isolated pattern. In that case, correction needs to be performed in a more detailed level than the deflection of a surface of a reticle or variation in advance pitch of the scanner device. That is, required is a reticle inspecting technique of performing inspection on a circuit including a high-density pattern and an isolated pattern with a high defect detecting sensitivity and suppressing an alignment error and a false defect. Incidentally, the "false defect" means a defect that is falsely determined to be a pattern defect in an inspection although a pattern defect, such as break of line, is not actually caused. The false defect is likely to occur when the entire pattern includes a misalignment.

The present invention has been made in view of the above-described problems, and a main object thereof is to provide a reticle inspecting method and a reticle inspecting apparatus capable of detecting a local misalignment on a reticle with high accuracy, efficiently suppressing the occurrence of a false defect, and detecting a defect with high detecting sensitivity.

SUMMARY OF THE INVENTION

In order to solve the above-described problems, the inventors of the present invention have found that highly-accurate position accuracy measurement data, which is obtained to ensure the registration accuracy of a pattern transferred onto a wafer, can be effectively used to prevent the occurrence of a false defect caused by a local misalignment, and have made the present invention.

The position accuracy measurement data obtained by a coordinate measuring device has higher position accuracy (coordinate resolution) than inspection data obtained when a defect of a drawing pattern is inspected (e.g., by a reticle inspecting apparatus). The coordinate resolution of the inspection data of a pattern defect is low because the position accuracy of a pattern depends on the size of a pixel of the reticle inspecting apparatus.

For example, in recent inspection data, one pixel is about 100 nm, and the inspection data is resolved on a grid of 100 nm. That is, the resolution of the inspection data obtained by the pattern defect inspecting method is 100 nm. On the other hand, in the coordinate measuring device, the position accuracy of a drawn pattern is measured on a 1 nm basis, so that highly-accurate measurement data can be obtained inside/outside a chip. The position accuracy measurement result obtained in this way inside-outside the chip is reflected to correction of the inspection data used in a pattern defect inspection. Accordingly, the inspection data is corrected based on the coordinate value that is more similar to the actual reticle pattern. Then, a defect on the reticle is detected by using the corrected inspection data.

According to the present invention, the occurrence of an alignment error and a false defect during a reticle inspection is suppressed and the processing ability of the inspecting apparatus enhances.

Further, during the inspection of a pattern defect, a locally-existing misalignment of an isolated pattern can be prevented from being detected as a false defect. Therefore, the inspection can be performed more efficiently.

BRIEF DESCRIPTION OF THE DRAWINGS

FIGS. 2A and 2B show correction of misalignment during alignment;

FIG. 13 is a flowchart showing a reticle defect inspecting method according to a second embodiment;

FIG. 14 is a schematic view showing the configuration of an inspecting system according to the second embodiment;

FIG. 16 shows an example of a pattern drawn on a reticle;

FIGS. 17A and 17B show position accuracy measurement positions on a reticle and a measurement result;

FIG. 20 is a schematic view showing the configuration of an inspecting system according to the third embodiment.

DESCRIPTION OF THE PREFERRED EMBODIMENTS

Figure 1:
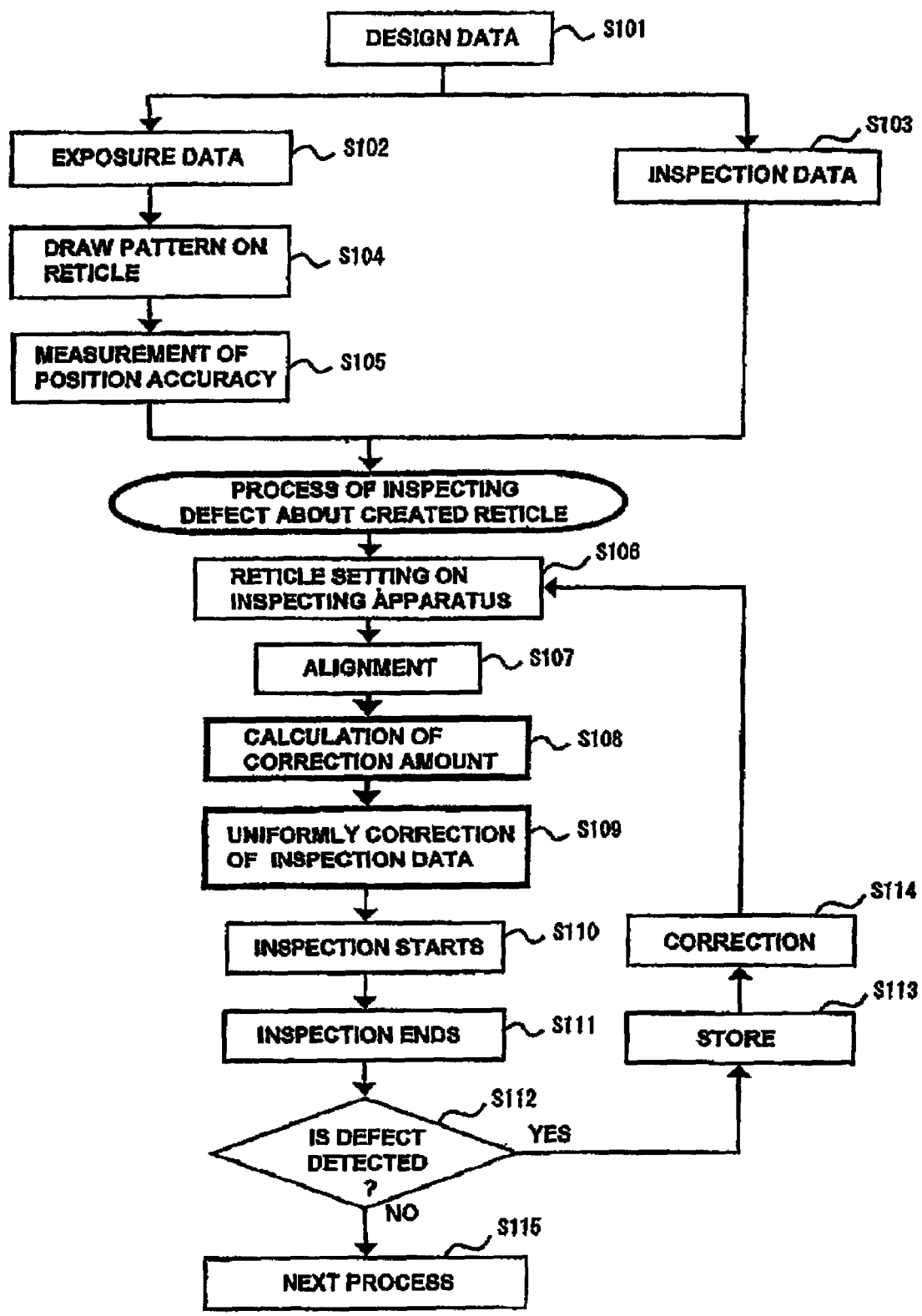
FIG. 1 is a flowchart showing a known reticle inspecting method.
Figure 3A:
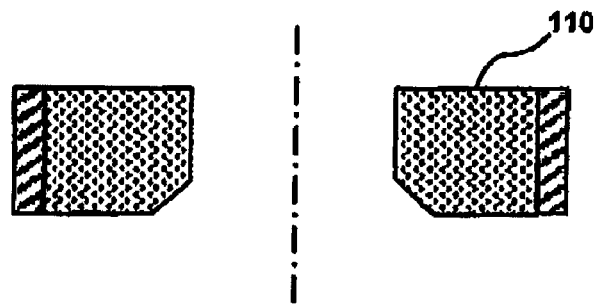
FIGS. 3A to 3C illustrate a uniform (linear) correction on inspection data performed in the known reticle inspecting method.
Figure 3B:
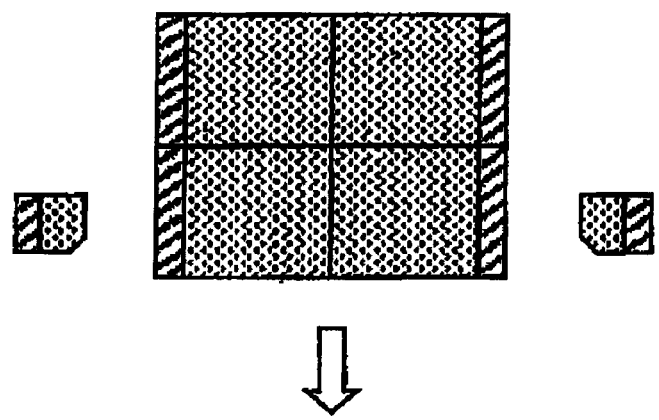
Figure 3C:
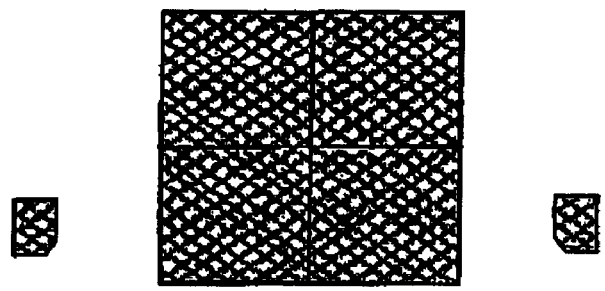
Figure 4A:
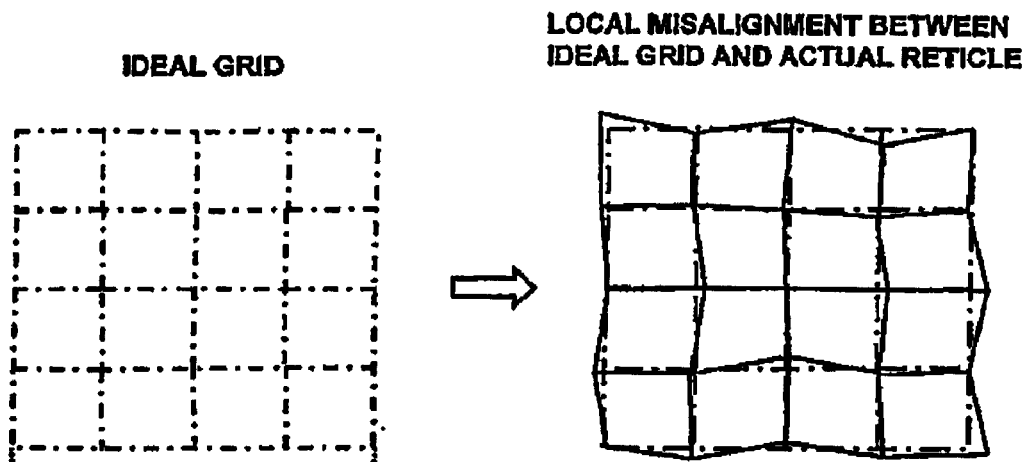
FIGS. 4A and 4B show difference between the uniformly corrected inspection data and the shrinkage ratio of an actual reticle in the known reticle inspecting method.
Figure 4B:
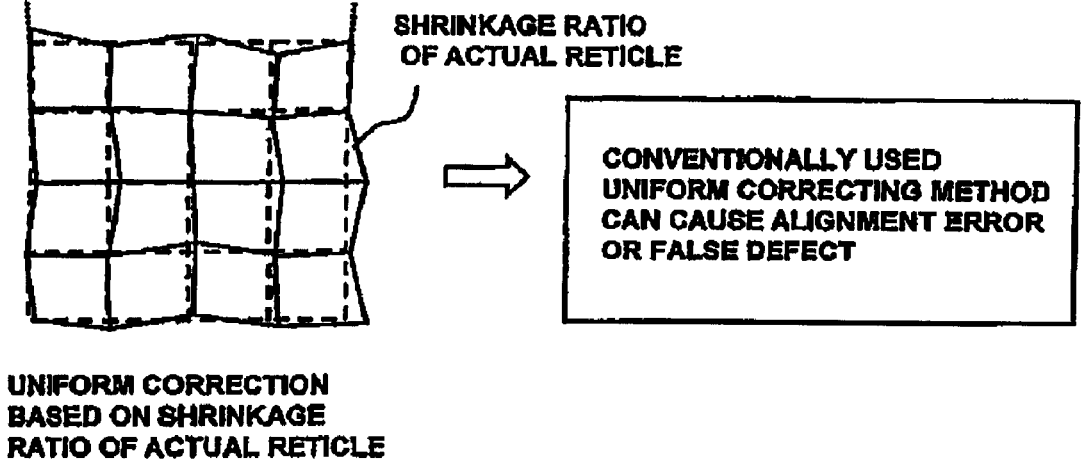

Before describing specific embodiments, the representative examples of various configurations realized by the present invention are described below.

According to a first aspect of the present invention, a reticle inspecting apparatus is provided. The reticle inspecting apparatus includes:

(a) an inspection data capturing unit configured to capture inspection data generated based on design data of a reticle;

(b) a measurement result capturing unit configured to capture position accuracy measurement data of a drawing position of the reticle;

(c) an inspection data correcting unit configured to correct the inspection data based on the position accuracy measurement data;

(d) an image obtaining unit configured to obtain image data of a pattern formed on the reticle; and (e) a defect detecting unit configured to detect a defect of the reticle based on the corrected inspection data and the image data.

In this inspecting apparatus, the inspection data is corrected by using the position accuracy measurement data that is measured with high accuracy inside/outside a chip. With this configuration, the occurrence of an alignment error and a false defect can be suppressed, and misalignment of an isolated pattern locally existing on the reticle can be detected with high sensitivity.

According to a second aspect of the present invention, a reticle inspecting method is provided. The reticle inspecting method includes the steps of:

(a) capturing inspection data to inspect a reticle;

(b) obtaining a first correction amount to correct a position accuracy component of the reticle by capturing drawing position accuracy measurement data of the reticle;

(c) correcting the inspection data based on the first correction amount; and (d) detecting a defect on the reticle based on the corrected inspection data.

In this inspecting method, the first correction amount is obtained based on the position accuracy measurement data that is measured with high accuracy inside/outside a chip, and the inspection data is corrected by using the first correction amount. With this method, the occurrence of an alignment error and a false defect can be suppressed, and misalignment of an isolated pattern locally existing on the reticle can be detected with high sensitivity.

According to a third aspect of the present invention, a reticle inspecting apparatus is provided. The reticle inspecting apparatus includes:

(a) an inspection data capturing unit configured to capture inspection data generated based on design data of a reticle;

(b) a measurement result capturing unit configured to capture position accuracy measurement data of a drawing position of the reticle, the data being based on a result obtained by measuring the drawing positions of a plurality of position accuracy measuring patterns drawn on the reticle;

(c) an inspection data correcting unit configured to correct the inspection data based on the position accuracy measurement data;

(d) an image obtaining unit configured to obtain image data of a pattern formed on the reticle in units of predetermined pixels; and (e) a defect detecting unit configured to detect a defect of the reticle based on the corrected inspection data and the image data.

In this inspecting apparatus, the inspection data is corrected by using the position accuracy measurement data that reflects local misalignment of a pattern transferred on the reticle and that can be measured with high accuracy. Then, the corrected inspection data is compared with the image data of a pattern obtained in units of predetermined pixels. With this configuration, misalignment of an isolated pattern locally existing on the reticle can be efficiently corrected with high sensitivity, so that the occurrence of a false defect can be efficiently suppressed.

According to a fourth aspect of the present invention, a reticle inspecting method is provided. The reticle inspecting method includes the steps of:

(a) capturing inspection data to inspect a reticle;

(b) obtaining a first correction amount to correct a position accuracy component of the reticle by capturing drawing position accuracy measurement data of the reticle, the data being based on a result obtained by measuring the drawing positions of a plurality of position accuracy measuring patterns drawn on the reticle;

(c) correcting the inspection data based on the first correction amount;

(d) obtaining image data of a pattern formed on the reticle in units of predetermined pixels; and (e) detecting a defect of the pattern formed on the reticle based on the corrected inspection data and the image data.

In this inspecting method, the first correcting amount is obtained based on the position accuracy measurement data that reflects local misalignment of a pattern transferred on the reticle and that can be measured with high accuracy. The inspection data is corrected by using the first correction amount, and the corrected inspection data is compared with the image data of a pattern obtained in units of predetermined pixels. With this method, misalignment of an isolated pattern locally existing on the reticle can be efficiently corrected with high sensitivity, so that the occurrence of a false defect can be efficiently suppressed.

Hereinafter, specific embodiments are described.

First Embodiment

Figure 5:
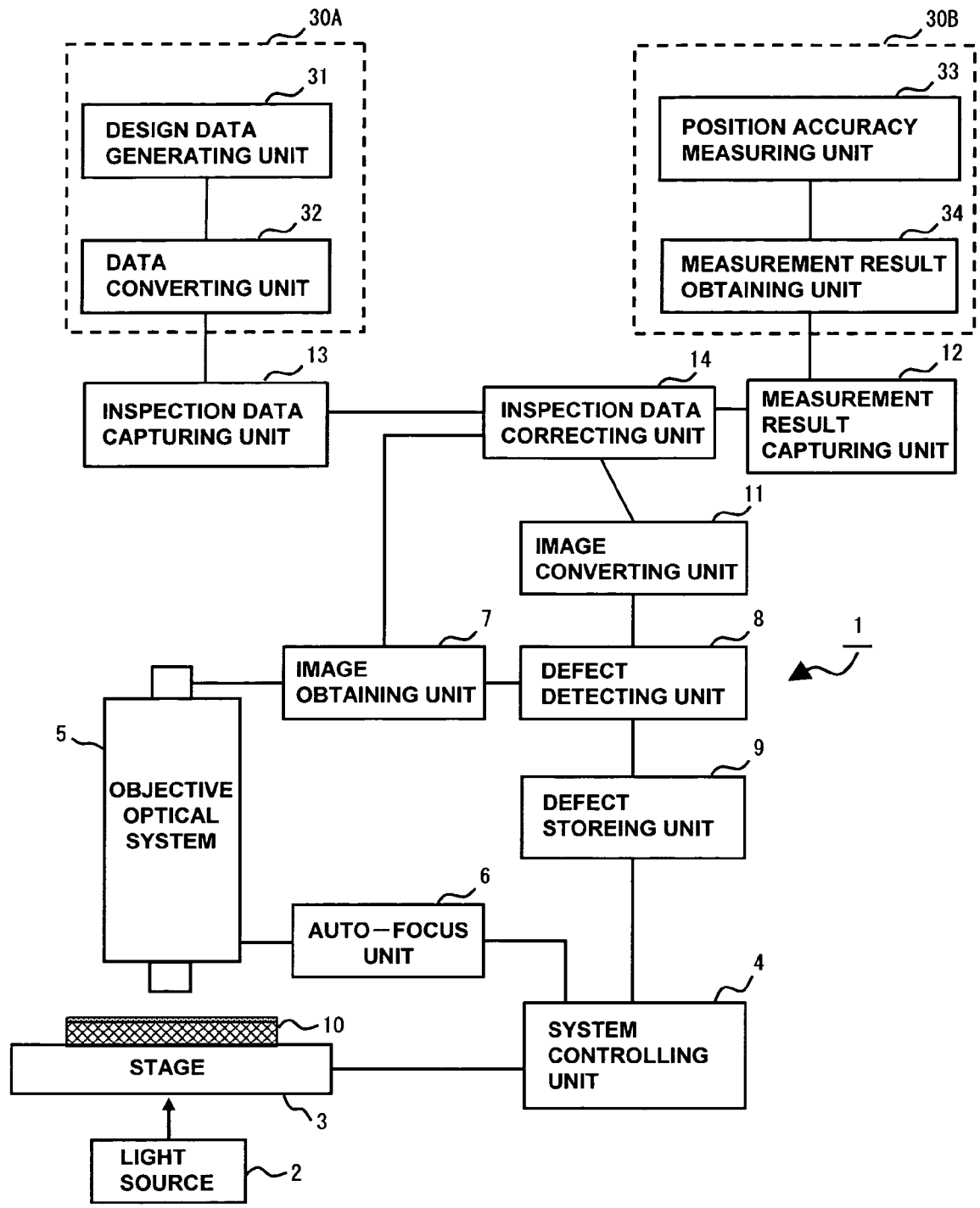
FIG. 5 is a schematic view showing the configuration of a reticle defect inspecting apparatus according to a first embodiment of the present invention.

Hereinafter, a first embodiment of the present invention is described with reference to the attached drawings. FIG. 5 is a schematic view showing the configuration of a reticle inspecting apparatus according to the first embodiment of the present invention.

In FIG. 5, a reticle inspecting apparatus 1 includes a stage 3 holding a reticle 10, a light source 2 to scan the reticle 10 by using laser light, an objective optical system to detect light beams passed through the reticle 10, an image obtaining unit 7 to obtain image data of a pattern formed on the reticle 10 based on the passed light beams, an auto-focus unit 6 to perform auto-focusing of the optical system, and a system controlling unit 4 to control the operation of the entire system, such as driving of the stage 3 and focus control.

The reticle inspecting apparatus 1 further includes an inspection data capturing unit 13, a measurement result capturing unit 12 to capture a measurement result of drawing position accuracy, an inspection data correcting unit 14, and a defect detecting unit 8.

The inspection data capturing unit 13 captures inspection data that is generated by data conversion from design data of the reticle 10 from a work station 30A. The measurement result capturing unit 12 captures the accuracy of the drawing position of the reticle 10, that is, the measurement data obtained by measuring the position accuracy, from a work station 30B. The inspection data correcting unit 14 corrects inspection data based on the position accuracy measurement data that is captured by the measurement result capturing unit 12. The defect detecting unit 8 detects a defect of the reticle 10 based on the corrected inspection data.

More specifically, the corrected inspection data is converted to reference image data by an image converting unit 11. The defect detecting unit 8 compares an actual image of the reticle 10 obtained by the image obtaining unit 7 with the reference image data so as to detect a defect of the reticle.

In the example shown in FIG. 5, the inspection data is generated in the work station 30A, which is separated from the reticle inspecting apparatus 1. In the work station 30A, a design data generating unit 31, such as a CAD, generates design data (drawing data), and a data converting unit 32 converts the design data to exposure data suitable for a drawing device and to inspection data used to inspect a defect.

On the other hand, the position accuracy measurement data is generated in the work station 30B, which is separated from the reticle inspecting apparatus 1. A position accuracy measuring unit 33 measures the accuracy of the drawing position on the reticle by using a highly-accurate coordinate system. A measurement result obtaining unit 34 obtains a measurement result generated by the position accuracy measuring unit 33.

In this way, the inspection data correcting unit 14 of the reticle inspecting apparatus 1 corrects the inspection data by using the highly-accurate position accuracy measurement data obtained based on the drawing of the reticle. Therefore, the inspection data, which is used as the reference image to detect a defect, can be corrected to become as similar as possible to the actual reticle.

The defect detecting unit 8 compares data by using the inspection data, which is more similar to the pattern arrangement of the actual reticle, and thus can detect misalignment of an isolated pattern that locally exists on the reticle 10 with high sensitivity.

Figure 6:
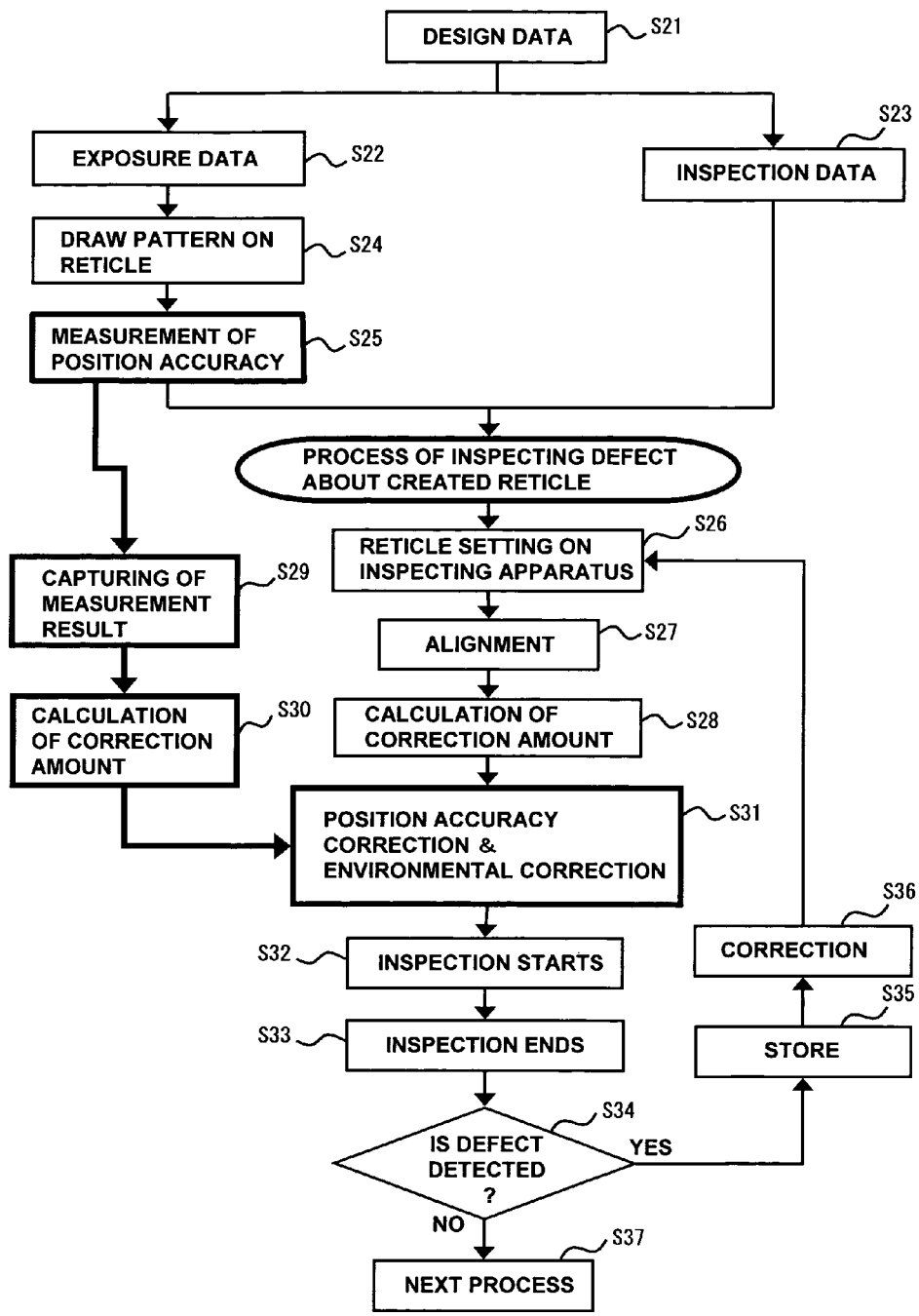
FIG. 6 is a flowchart showing a reticle defect inspecting method according to the first embodiment of the present invention.

FIG. 6 is a flowchart of a reticle inspecting method according to the first embodiment of the present invention. First, in step S21, design data is generated by the CAD or the like used in the work station 30A. In step S22, the design data generated in step S21 is converted to exposure data of a form suitable for the drawing device. On the other hand, in step S23, the design data is converted to inspection data used to detect a defect. As described above, the inspection data is generated based on the design data so as to be as similar as possible to the actual reticle pattern.

In step S24, a pattern is drawn on the reticle 10 based on the exposure data (drawing on reticle). Then, in step S25, the position accuracy of the drawing is measured to obtain position accuracy measurement data. The position accuracy measurement data can be obtained by measuring position accuracy measuring patterns on the reticle 10 by using a highly-accurate coordinate measuring device.

Figure 7A:
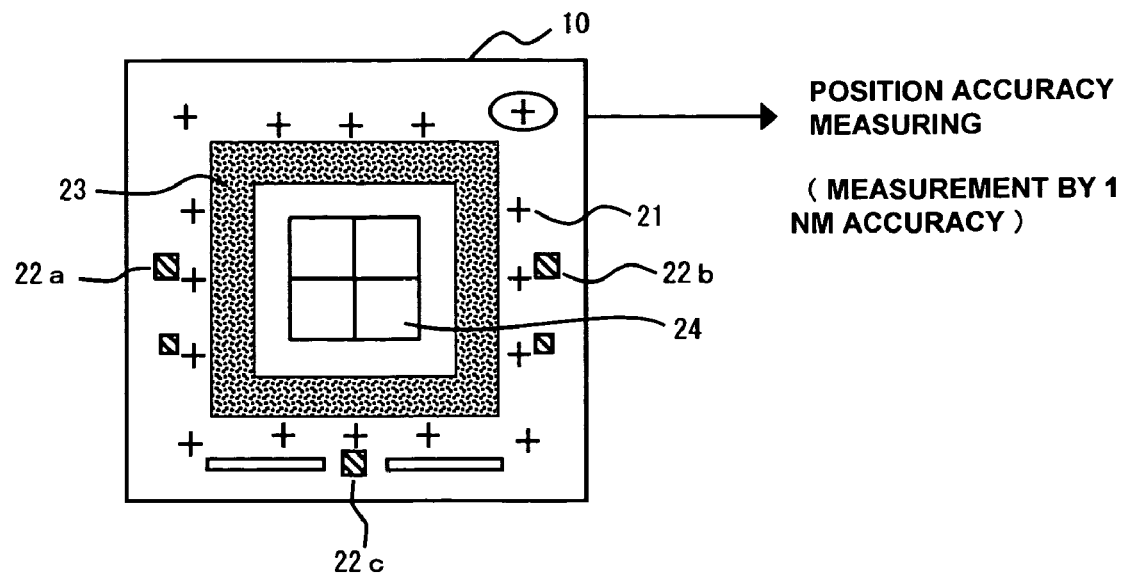
FIGS. 7A and 7B illustrate alignment of a reticle in the flowchart shown in FIG. 6.

For example, as shown in FIG. 7A, position accuracy measuring patterns 21 for measuring position accuracy are provided inside/outside chips 24 on the reticle 10. In the example shown in FIG. 7A, the position accuracy measuring patterns 21 are drawn only outside a light shield 23 for convenience. However, the position accuracy measuring patterns 21 can be placed inside the chip areas 24, so that the coordinates of the drawing pattern at each chip position can be obtained.

Now, the above-mentioned method for measuring the position accuracy (the position accuracy measuring method) is described in detail with reference to FIGS. 9A, 9B, 10A, and 10B.

Figure 9A:
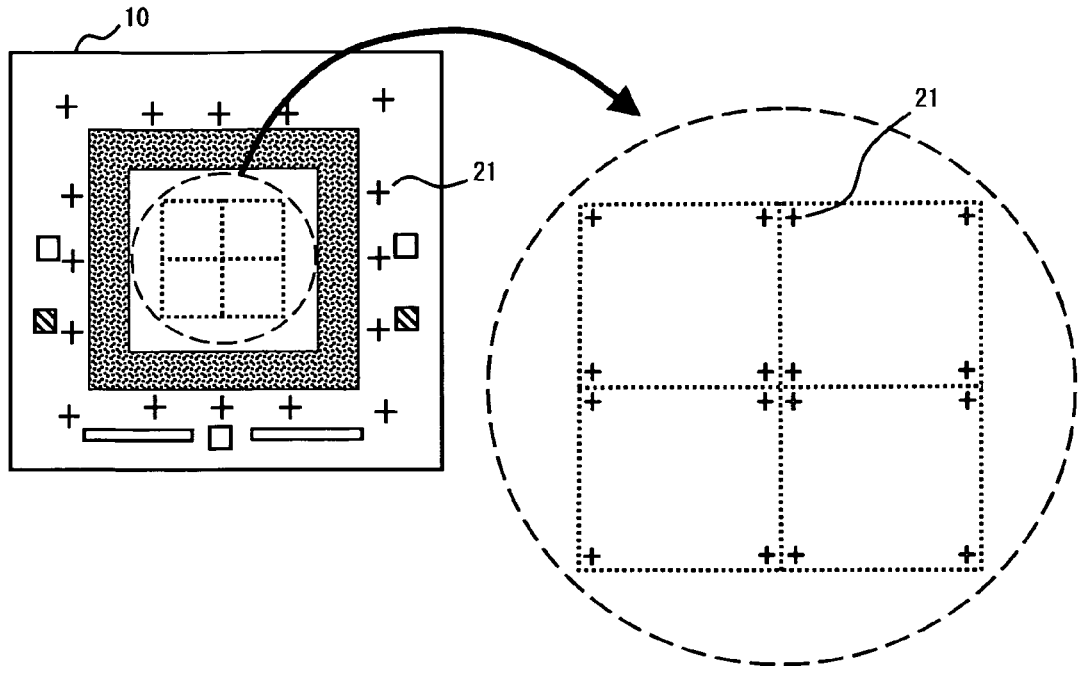
FIGS. 9A and 9B show examples of arrangement of position accuracy measuring cross patterns.
Figure 9B:
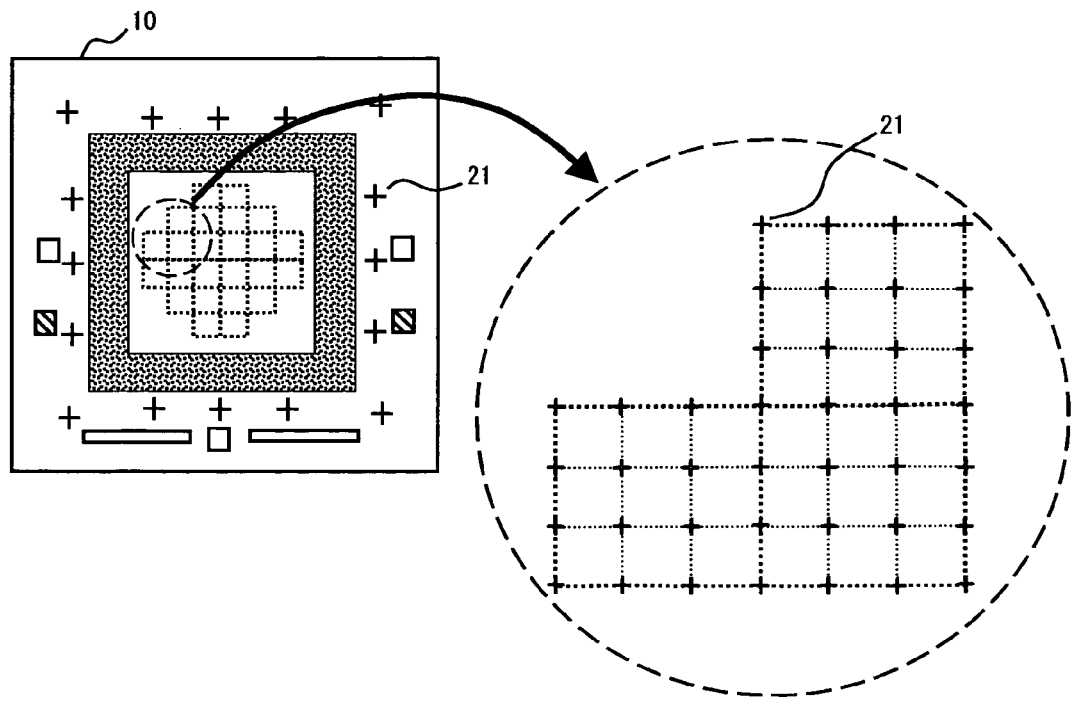

FIGS. 9A and 9B show examples of arrangement of cross patterns for measuring position accuracy used in the position accuracy measuring method. The cross patterns (the position accuracy measuring patterns 21) shown in FIGS. 9A and 9B are used to measure the position accuracy. Each section (area) defined by dotted lines inside the reticle 10 shown in the right side of the figure corresponds to one chip.

In the arrangement example No. 1, a pattern area corresponding to four chips is shown in the enlarged view on the right. The position accuracy measuring patterns 21 are placed at four corners in each chip. On the other hand, in the arrangement example No. 2, a pattern area corresponding to three chips is shown in the enlarged view on the right. In the arrangement example No. 2, the entire area of each chip is divided into nine sections in a matrix pattern. The position accuracy measuring patterns 21 are placed at the respective positions where dividing lines cross. Among these arrangement examples, the positions of the cross patterns can be measured with higher accuracy in the arrangement example No. 2.

Figure 10A:
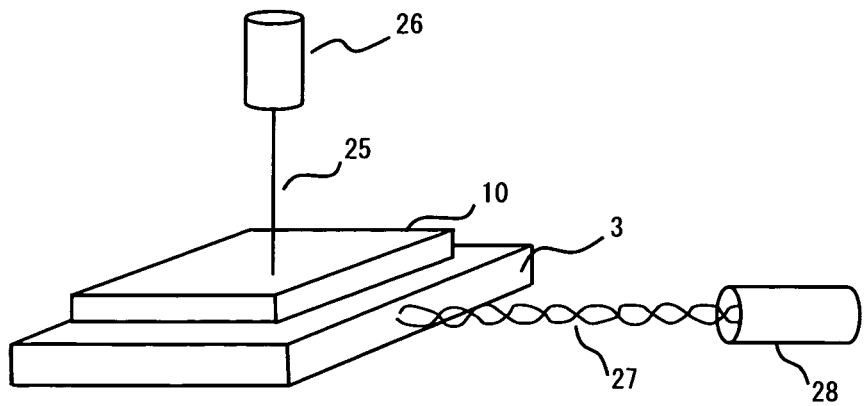
FIGS. 10A and 10B illustrate a method for measuring position accuracy.
Figure 10B:
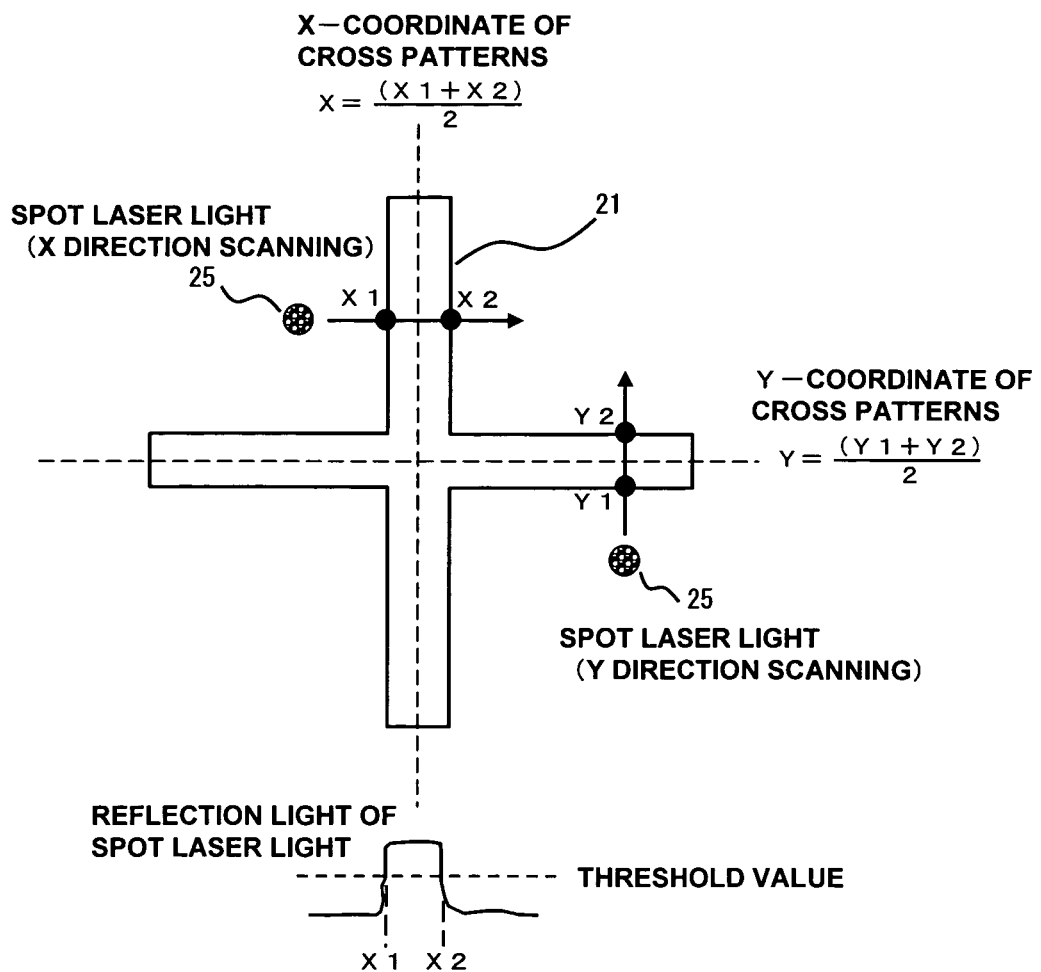

FIGS. 10A and 10B illustrate a method for measuring position accuracy. FIG. 10A shows a device of measuring the position accuracy measuring cross patterns 21. As shown in FIG. 10A, laser light 27 is applied onto a side surface of the stage 3 on which the reticle 10 is mounted. The laser light 27 is output from a position measuring laser 28. Then, (light and dark) of interference fringes generated by irradiation light and reflection light of the laser light 27 are measured so as to measure the coordinates of the stage 3 and the reticle 10 mounted thereon. The measurement accuracy is different depending on the wavelength of the laser light used. Recently, however, the coordinate resolution of nanomicron has been realized.

Further, as shown in FIG. 10A, spot laser light 25 is applied toward the reticle 10 from just above the reticle 10. Then, the waveform of the reflection light of the spot laser light 25 is measured while moving the position of the stage in the X direction, so as to obtain the waveform of the reflection light of the spot laser light shown in FIG. 10B. FIG. 10B illustrates a method for measuring the position accuracy measuring cross patterns. The reflection waveform obtained in this manner is compared to a preset reference level (threshold value) so as to detect the coordinates (X1, X2) of a pattern edge. Then, by using the equation shown in FIG. 10B, the center X coordinate of the position accuracy measuring pattern 21 is obtained. The Y coordinate is also obtained in the same method as in the X coordinate.

Figure 7B:
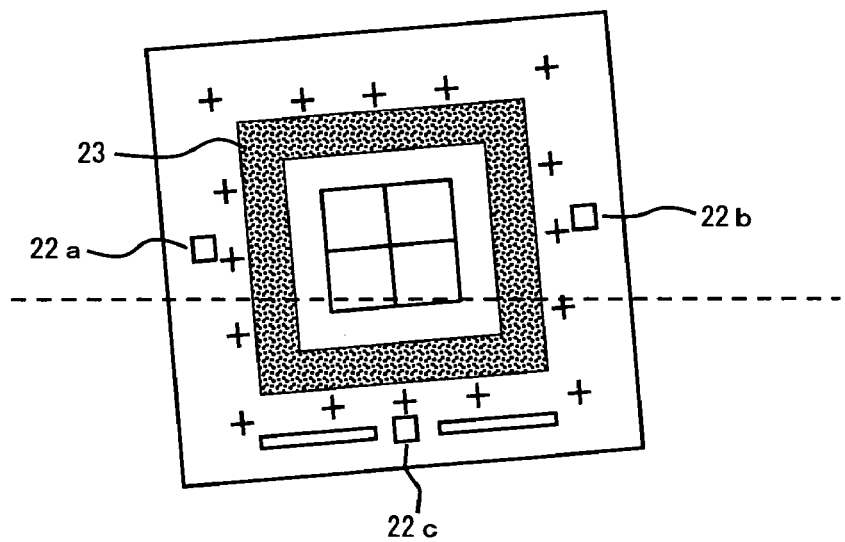

Referring back to FIG. 6, a reticle inspecting process starts. In step S26, the reticle is set on the inspecting apparatus. In step S27, the reticle is aligned with the inspection data. FIG. 7B shows a state where the reticle is set on the inspecting apparatus. The alignment is performed by using alignment marks 22a, 22b, and 22c formed at three positions on the reticle 10, as shown in FIG. 7B. The alignment is performed at these three marks so as to calculate a correction amount under the environment of the inspecting apparatus (temperature or a stage factor).

In step S28, an environmental correction amount (second correction amount) under the environment of the reticle inspecting apparatus 1 is calculated. For example, the ratio of expansion/shrinkage of the alignment mark caused by change in temperature or a misalignment component relating to setting on the stage is calculated.

On the other hand, in step S29, the measurement result of the accuracy of the drawing position obtained in step S25 is captured. In this way, a correction amount is calculated after the measurement result is captured. That is, in step S30, a position accuracy correction amount (first correction amount) used to correct individual misalignment at a local position of each chip is calculated.

In step S31, the inspection data is corrected based on the position accuracy correction amount (first correction amount), which is a position accuracy component, and the environmental correction amount (second correction amount), which is an inspection environment component.

In step S32, inspection starts. Specifically, the image obtained by laser-scanning the reticle 10 on which a circuit pattern is formed is compared with the reference image obtained by converting the inspection pattern corrected in step S31. If a mismatch exists, the mismatch is detected as a defect.

Now, the method for inspecting a defect of a pattern (the pattern defect inspecting method) described above is described in detail with reference to FIGS. 11, 12A, and 12B.

Figure 11:
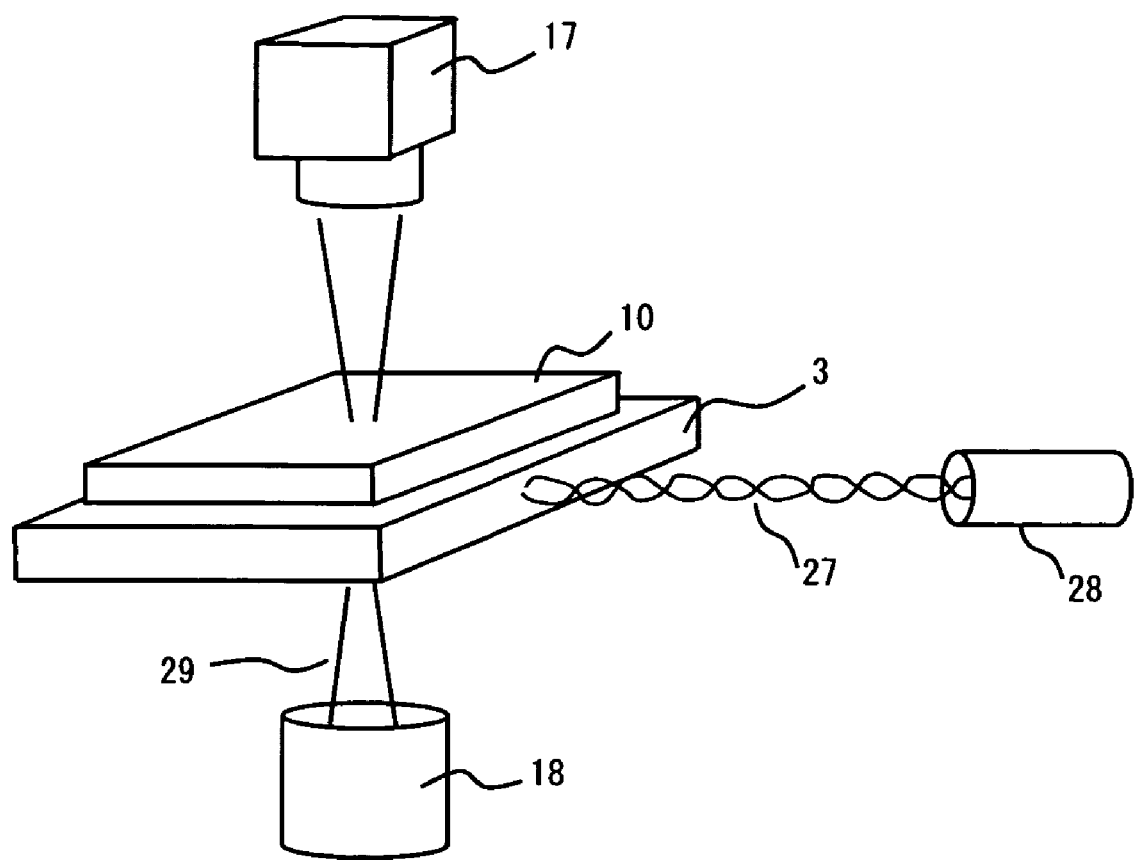
FIG. 11 shows a pattern defect inspecting apparatus.

FIG. 11 shows a pattern defect inspecting apparatus (reticle inspecting apparatus). As shown in the figure, the reticle 10 is mounted on the stage 3. Then, laser light 29 output from a coordinate measuring laser 18 is applied to the rear side of the reticle 10. The laser light 29 passed through the reticle 10 is received by a CCD camera 17 or the like. Whether a pattern exists is detected based on the intensity of the received light.

The coordinates of the reticle 10 are measured by applying the laser light 27 from the position measuring laser 28 to a side surface of the stage 3, as in the position accuracy measuring method shown in FIGS. 10A and 10B.

Figure 12A:
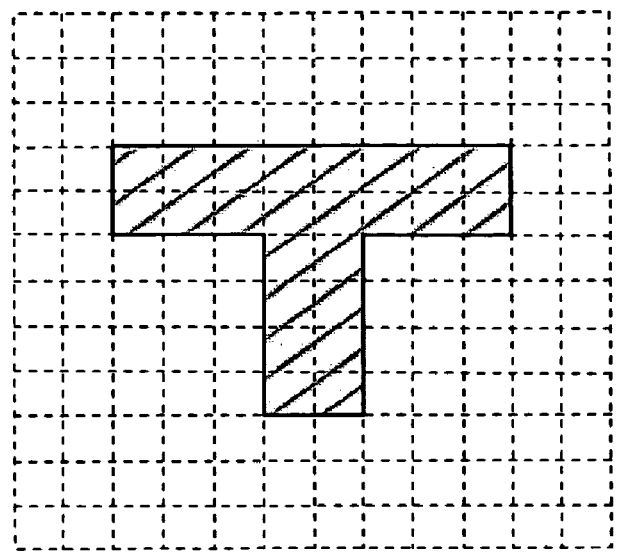
FIGS. 12A and 12B illustrate correction of a position during pattern defect inspection.
Figure 12B:
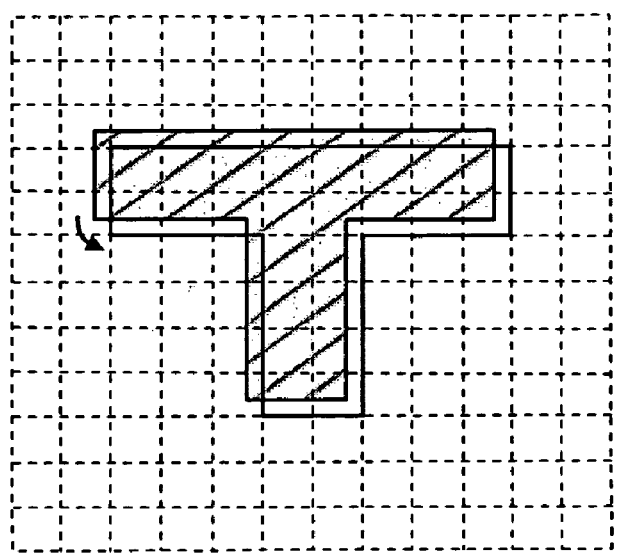

FIGS. 12A and 12B show a method for correcting the position of a recognized pattern in the pattern defect inspecting method. The grid shown in FIGS. 12A and 12B represents pixels of the objective optical system 5 in the reticle inspecting apparatus, and the size of the grid depends on the resolution of the CCD camera 17. The resolution of the CCD camera 17 at the present is about 0.1 μm (100 nm).

As shown in FIG. 12A, when the drawn pattern is aligned with the grid, the coordinates on the grid at the detected position are recognized as a position where the drawn pattern exists. On the other hand, as shown in FIG. 12B, when the drawn pattern is misaligned with the grid, the position where the drawn pattern is detected is corrected to the lines of the grid nearest to the detected position, and the position on the grid after correction is recognized as the detected position. In this way, in detection of a pattern defect, the existence of a drawn pattern is determined for the respective boxes of the grid. In other words, image data of a pattern (drawn pattern) formed on the reticle is obtained in units of predetermined pixels.

Referring back to FIG. 6, the inspection of the entire reticle ends in step S33. In step S34, whether a defect exists on the reticle is determined based on the inspection result. If a defect exists, defect information is stored in step S35. Then, in step S36, the residual defect on the reticle is corrected based on the defect information. If no defect exists, the process proceeds to the next process in step S37.

Figure 8A:
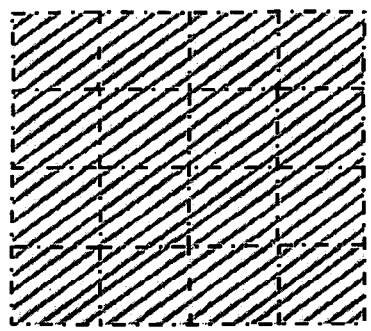
FIGS. 8A, 8B and 8C illustrate nonlinear correction on the inspection data using position accuracy measurement data in step S31 of the flowchart shown in FIG. 6.
Figure 8B:
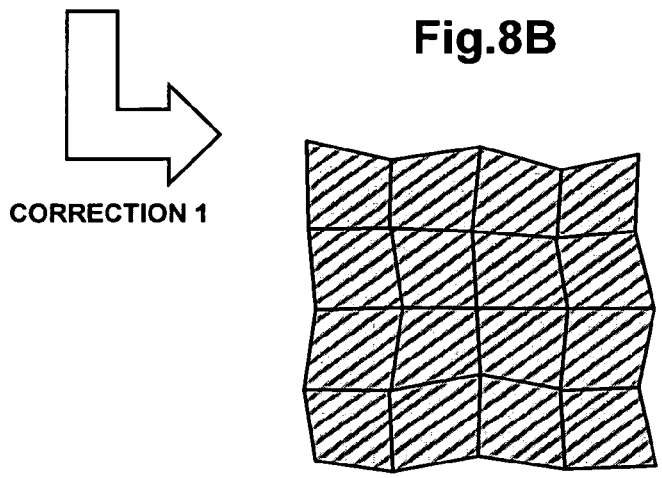
Figure 8C:
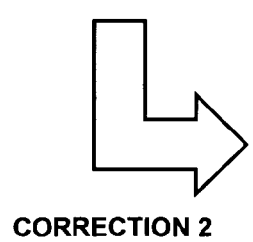

FIGS. 8A and 8B illustrate correction of the inspection data performed in step S31 shown in FIG. 6. FIG. 8A shows the status of the inspection data in step S23. As shown in FIG. 8A, the inspection data generated based on the design data in step S23 is multiplied by the correction amount (first correction amount) of a nonlinear position accuracy component obtained in step S30, so that the corrected inspection data shown in FIG. 8B is obtained. That is, FIG. 8B shows the status of the inspection data generated by converting the inspection data shown in FIG. 8A with a nonuniform and nonlinear shrinkage ratio and multiplying it by the correction amount calculated in step S30.

By further multiplying this inspection data by the correction amount (second correction amount) based on an environment component obtained in step S28, the inspection data that is more similar to the actual reticle pattern can be obtained. In the reticle correcting method according to the above-described embodiment, a local distortion in the actual reticle can be reflected to the correction of the inspection data, unlike in the known method of multiplying the inspection data by a predetermined correction amount, for example, correction values (x, y, and θ).

In other words, by performing data comparing inspection by using not only inspection data corrected with linear function of the known art but also inspection data that is more similar to the actual reticle pattern, an alignment error and a false defect of an isolated pattern can be effectively suppressed. Further, a local misalignment can be detected with higher accuracy.

Second Embodiment

Next, a second embodiment is described.

FIG. 13 is a flowchart showing a reticle defect inspecting method according to the second embodiment. As shown in FIG. 13, in this embodiment, the inspection data is corrected by reflecting the result of position accuracy measurement thereto before starting a reticle defect inspecting process.

First, in step S221, design data is generated. The design data has a form as shown in D1 of FIG. 16, for example. In step S222, the design data generated in step S221 is converted to exposure data of a form suitable for a drawing device. The exposure data generated by conversion has a form as shown in D2 of FIG. 16, for example. In step S223, the design data is converted to inspection data used to detect a defect. The inspection data generated by conversion has a form as shown in D4 of FIG. 16, for example. The inspection data is generated based on the design data so as to be similar to the pattern of the actual reticle.

In step S224, a pattern is drawn on the reticle (reticle drawing) based on the exposure data. The drawn pattern is distorted to have a local misalignment. In step S225, the position accuracy of the drawn pattern is measured to obtain position accuracy measurement data. The position accuracy measurement data can be obtained by performing measurement in the method described above with reference to FIGS. 9A to 10B.

Then, in step S250, the inspection data generated in step S223 is corrected. That is, the result of the position accuracy measurement is reflected to the inspection data. More specifically, the correction is performed in the following manner. First, the measurement data, which is the result of position accuracy measurement obtained in step S225, is captured. Based on the captured measurement data, a position accuracy correction amount (first correction amount) for correcting misalignment is calculated. The calculation is locally performed in units of predetermined minute areas. Then, based on the position accuracy correction amount, the inspection data is corrected in units of the predetermined minute areas.

Then, a reticle inspecting process starts. In step S226, the reticle is set on the inspecting apparatus. In step S227, the alignment pattern drawn on the reticle is aligned with the inspection data. The measurement of the alignment is performed in the same manner as in the first embodiment. For example, as shown in FIG. 7B, the alignment is performed by using the alignment marks 22a, 22b, and 22c formed at three positions on the reticle 10.

In step S228, a correction amount depending on the environment of the reticle inspecting apparatus, that is, an inspection environment component in the correction amount (second correction amount) is calculated. The inspection environment component is, for example, a correction amount including the ratio of expansion/shrinkage of the alignment mark due to change in temperature and a misalignment component relating to setting on the stage.

In step S231, the inspection data is uniformly corrected based on the inspection environment component (second correction amount) obtained in step S228.

In step S232, inspection starts. That is, an image obtained by laser-scanning the reticle on which a circuit pattern is formed is compared with a reference image obtained by converting the inspection pattern that is corrected in step S231. If a mismatch therebetween exists, the mismatch is detected as a defect.

In step S233, inspection of the entire reticle ends. Then, in step S234, whether a defect exists on the reticle is determined based on the inspection result. If a defect exists, the process proceeds to step S235 where defect information is stored. Then, in step S236, the defect (residual defect) on the reticle is corrected based on the defect information. If no defect exists, the process proceeds to the next process in step S237.

Next, an example of an inspecting system realizing the reticle inspecting method shown in the flowchart is described with reference to the drawings.

FIG. 14 is a schematic view showing the configuration of the inspecting system according to the second embodiment. In FIG. 14, some of the steps of the above-described flowchart are shown in addition to the configuration of the inspecting system so that the relation to the flowchart can be clearly understood.

In the inspecting system shown in FIG. 14, the exposure data obtained in step S222 is stored in a server A 217. The exposure data stored in the server A 217 is converted to inspection data in step S223 and the inspection data is stored in a server C 213.

On the other hand, in step S224, a pattern is drawn on a reticle by the drawing device based on the exposure data stored in the server A 217. Specifically, the drawing is performed in the following order: (1) drawing pattern; (2) development; (3) etching; (4) peeling resist; and (5) cleaning. The drawn pattern has the form shown in D3 of FIG. 16, for example.

In step S225, the position accuracy of the drawn pattern is measured. An example of the result obtained by the measurement is shown in FIG. 17B. At this time, orthogonality and shrinkage ratio are measured by using the position accuracy measuring patterns drawn inside/outside a chip of the reticle. As a position accuracy measuring device, "Lightwave 6i/Lightwave 5i" made by Nikon Corporation or "LMS-IPRO-II/III" made by Leica Microsystems can be used.

FIG. 17A shows measurement positions on the reticle at which the position accuracy of the drawn pattern is measured in step S225. The grid formed of dotted lines shown in FIG. 17A is an ideal grid indicating reference positions used in the measurement. FIG. 17B shows an example the position accuracy measurement result at the respective measurement positions. As shown in the figure, a misalignment component in the X direction (X coordinate) and a misalignment component in the Y direction (Y coordinate) with respect to the reference position (in the ideal grid) are measured at each measurement position. Incidentally, one of the factors to cause "misalignment (distortion)" from the reference position at each measurement position may be the processing accuracy of an exposing device.

In step S240, the measurement data obtained in the position accuracy measurement in step S225 is output to a server B 212, and the measurement data is stored in the server B 212.

The position accuracy measurement data stored in the server B and the inspection data stored in the server C are transmitted to a correcting computer 214. The correcting computer 214 receives the data and calculates a position accuracy correction amount (first correction amount) used to locally correct a misalignment in units of predetermined minute areas. Then, the correcting computer 214 corrects the inspection data based on the position accuracy correction amount obtained by the calculation.

Figure 18:
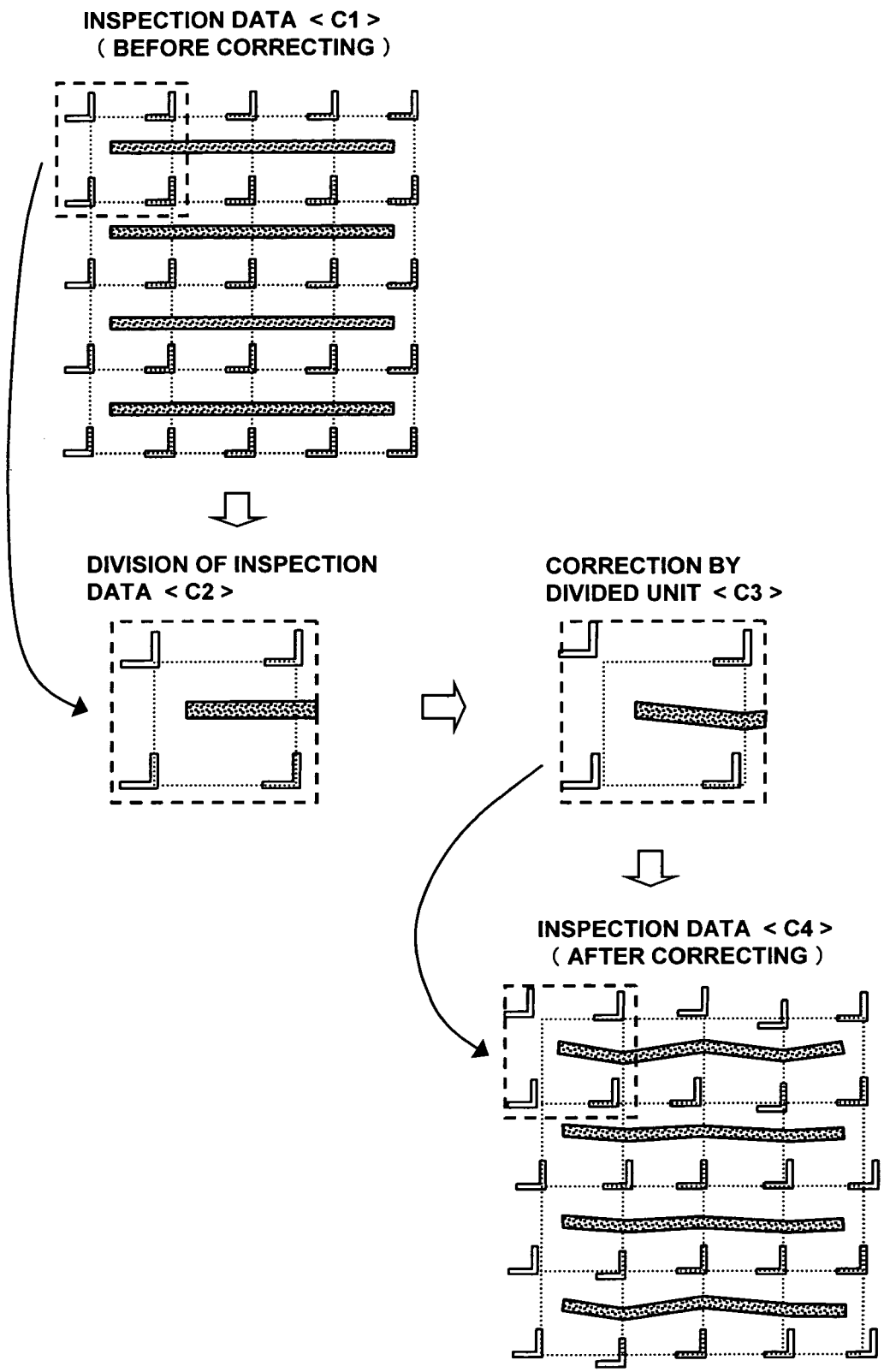
FIG. 18 shows an example of correction of inspection data.

FIG. 18 shows an example of a process of correcting the inspection data performed in the correcting computer 214. As shown in FIG. 18, the inspection data is divided into measurement areas (C2) before correction, and correction is performed in each area (C3). More specifically, the vector at four measurement positions 1, 2, 6, and 7 shown in FIG. 17A is calculated to add distortion to the inspection data. Then, by combining the respective corrected areas, corrected inspection data is obtained (C4).

In the above-described correction, local correction may be performed by dividing the inspection data into smaller areas. The other steps are performed in the same manner as in the first embodiment.

As described above, when the inspection data is locally corrected in units of minute areas before pattern defect inspection starts, only the correction based on an inspection environment component needs to be performed in the pattern defect inspecting process. With this method, the inspecting process can be simplified.

Referring to FIG. 14, data transmission among the respective servers, the correcting computer 214, and the reticle inspecting apparatus 201 is performed through a network 220, such as a LAN (local area network). Alternatively, the Internet can be used as the network 220.

The inspection data corrected in the correcting computer (the calculation unit for correction) 214 is stored in a server D 215. The corrected inspection data stored therein is transmitted to an image converting unit 211 of the reticle inspecting apparatus 201.

The reticle inspecting apparatus 201 receives the corrected inspection data and performs correction in accordance with step S226 and thereafter shown in FIG. 13. The reticle inspecting apparatus 201 is mainly composed of an inspection mechanism unit 219 that actually performs inspection and a control unit 218 that controls each mechanism of the inspection mechanism unit 219.

The inspection mechanism unit 219 includes a stage 203 to hold a reticle 210, a light source 202 to laser-scan the reticle 210, and an objective optical system 205 to detect light beams passed through the reticle 210.

The control unit 218 includes an image obtaining unit 207 to obtain image data of a pattern formed on the reticle 210 through the passed light, an auto-focus unit 206 to perform auto focusing of the optical system, and a system control unit 204 to control the operation of the entire system, such as drive of the stage 203 and focus control. The control unit 218 further includes the image converting unit 211 to receive the corrected inspection data and converts the inspection data to a data format suitable for the reticle inspecting apparatus 201, a defect detecting unit 208 to detect a pattern defect, and a defect storing unit 209 to store the position of a defect.

Figure 15:
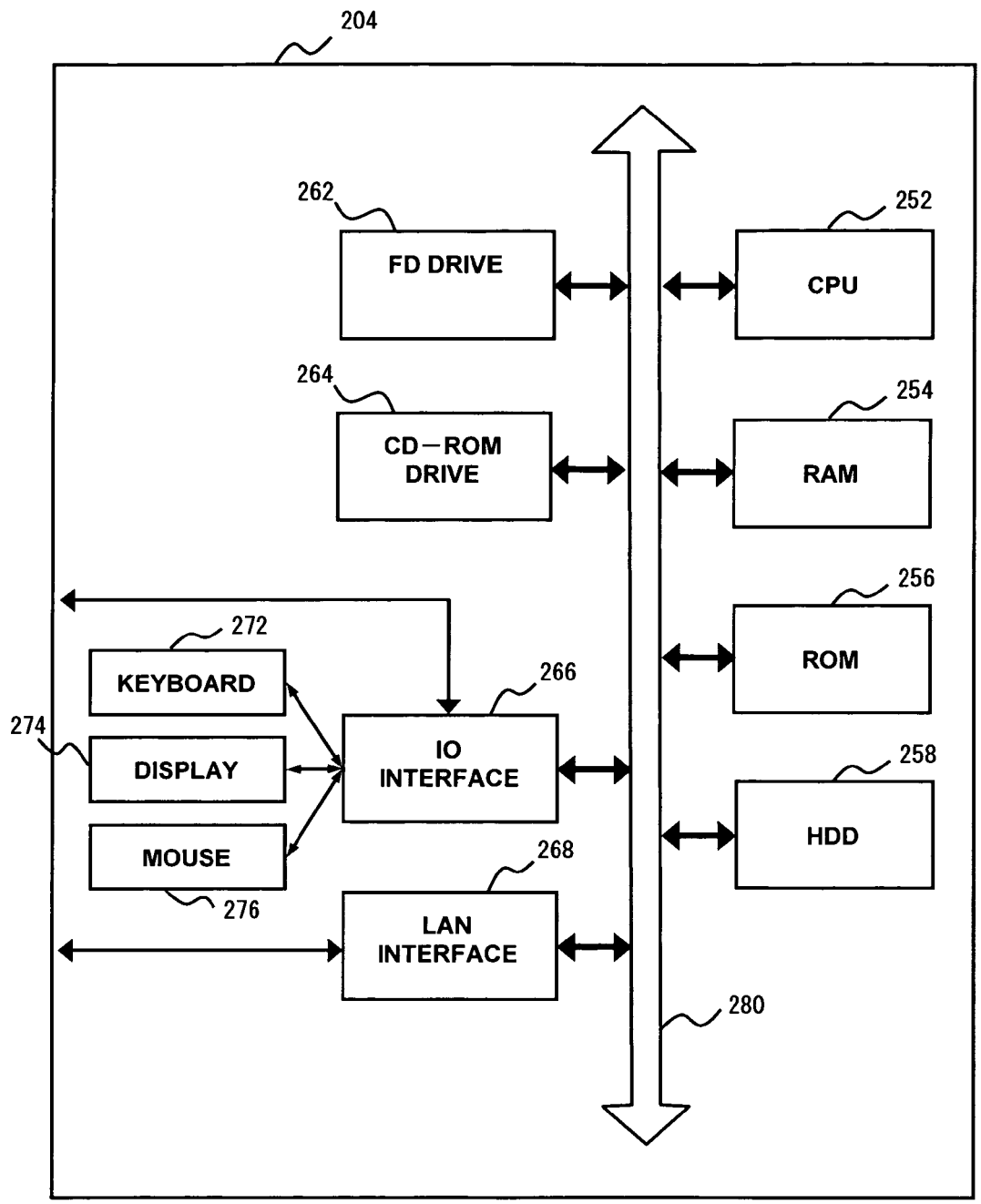
FIG. 15 shows an example of a system control unit.

FIG. 15 shows an example of the configuration of the system control unit 204. As shown in FIG. 15, the system control unit 204 includes principal functions, such as a CPU 252 to control the entire system, a RAM 254 to temporarily store data, a ROM 256 in which necessary data is written in advance, an HDD 258 to store internal data, and a bus line 280 to connect those units. Also, the system control unit 204 is provided with peripheral devices, such as a keyboard 272 to input data through an IO interface 266, a display 274 to visually display the internal data, and a mouse 276 to indicate an arbitrary position on the display 274. The system control unit 204 is further provided with an FD drive 262 to externally input/output data, a CD-ROM drive 264, and a LAN interface 268.

Third Embodiment

Next, a third embodiment is described.

Figure 19:
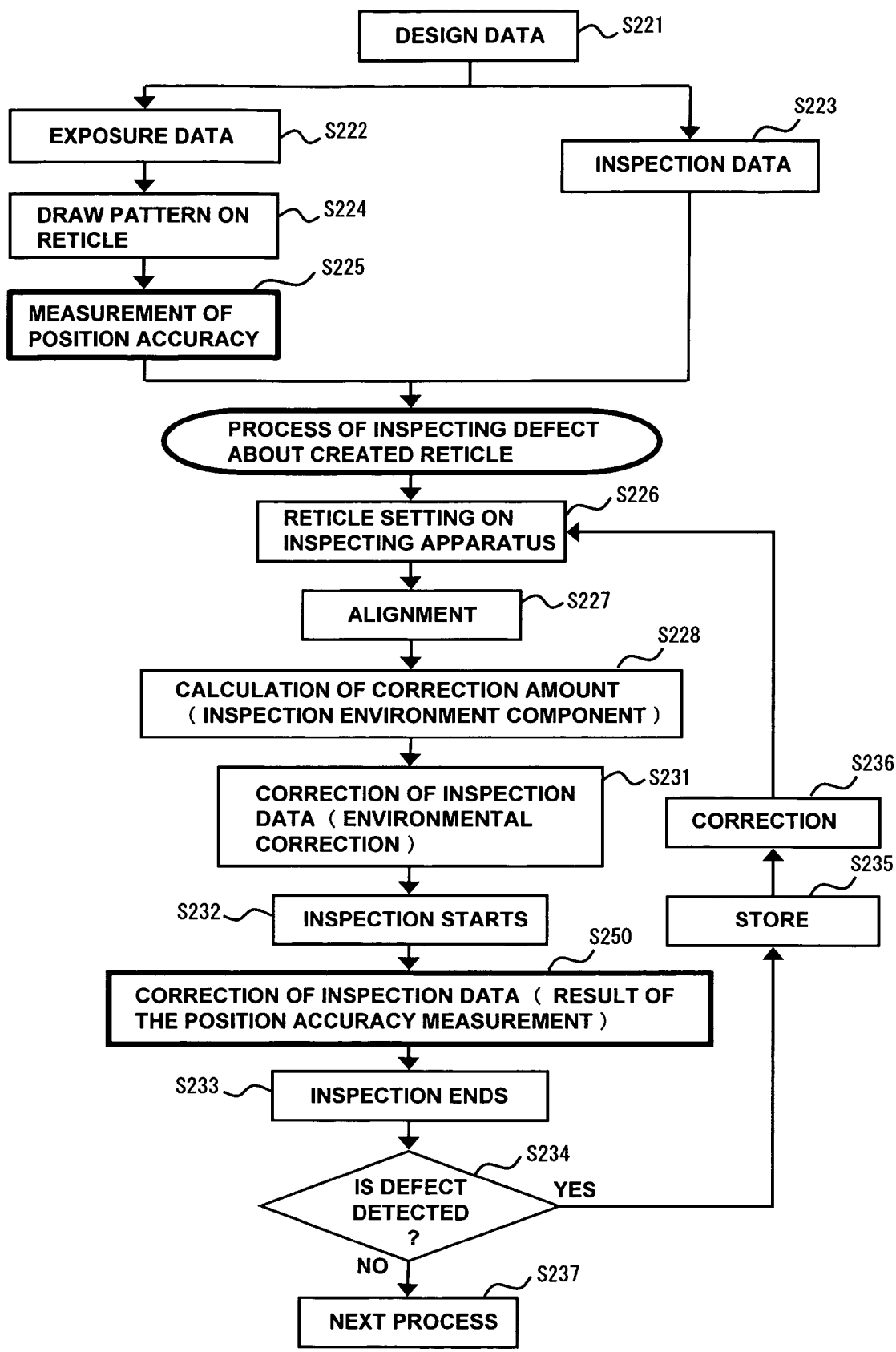
FIG. 19 is a flowchart showing a reticle defect inspecting method according to a third embodiment.

FIG. 19 is a flowchart according to the third embodiment, and FIG. 20 is a schematic view showing the configuration of an inspecting system according to the third embodiment.

In the third embodiment, correction of inspection data that is performed in the correcting computer 214 (in the second embodiment) is performed in the reticle inspecting apparatus 201, instead of in the correcting computer 214.

More specifically, as shown in FIG. 19, step S250 of correcting the inspecting data is performed in the pattern defect inspecting process. This step S250 is performed by a calculation unit for correction 244 provided in the reticle inspecting apparatus 201, as shown in FIG. 20. The other steps are the same as those in the second embodiment.

As described above, according to the reticle inspecting method and apparatus according to the embodiments of the present invention, an alignment error and a false defect caused during data comparing inspection can be suppressed. Accordingly, interruption of inspection or re-inspection can be prevented and thus the processing ability of the inspecting apparatus enhances (more reticles can be inspected).

Accordingly, a process of inspecting a reticle can be performed more quickly. Further, a process of supplying a reticle to a wafer process and a process of manufacturing a device can be performed more quickly.

During the pattern defect inspection, misalignment of an isolated pattern that locally exists can be prevented from being detected as a false defect. Therefore, the inspection can be performed more efficiently than in the known art, which contributes to increase yields of manufacturing reticles.

Since the inspecting method according to the present invention uses corrected inspection data, the pattern on the reticle inspected by this method includes a "misalignment component" unique to the drawing device that draws the pattern. However, this "misalignment component" unique to the drawing device does not cause a practical problem in a process of manufacturing a semiconductor device in which a pattern is formed on a wafer. This is because, for example, if a plurality of layers of patterns on one wafer are formed by using a reticle group that is made by a specific (same) drawing device, all of the patterns include the same "misalignment component" and eventually the positions match. The semiconductor device manufactured by using a reticle group made by a specific drawing device does not have misalignment between pattern layers. Such a semiconductor device is not inferior to a semiconductor device made by using a highly-accurate reticle group of the known art.

What is claimed is:

1. A reticle inspecting apparatus comprising:
   an inspection data capturing unit configured to capture inspection data generated based on design data of a reticle;
   a measurement result capturing unit configured to capture position accuracy measurement data of a drawing position of the reticle;
   an inspection data correcting unit configured to correct the inspection data based on the position accuracy measurement data;
   an image obtaining unit configured to obtain image data of a pattern formed on the reticle; and
   a defect detecting unit configured to detect a defect of the reticle by comparing the corrected inspection data with the image data.

2. The reticle inspecting apparatus according to claim 1, wherein the inspection data correcting unit combines the corrected inspection data and the position accuracy measurement data in order to generate corrected inspection data.

3. The reticle inspecting apparatus according to claim 1, further comprising: an image converting unit configured to convert the corrected inspection data to a reference image, wherein the defect detecting unit compares a reticle image obtained by scanning the reticle with the reference image in order to detect a defect of the reticle.

4. The reticle inspecting apparatus according to claim 1, wherein the position accuracy (coordinate resolution) of the position accuracy measurement data is higher than at least that of the inspection data.

5. The reticle inspecting apparatus according to claim 1, wherein the position accuracy measurement data of the drawing position of the reticle captured by the measurement result capturing unit is based on a result obtained by measuring the drawing positions of a plurality of position accuracy measuring patterns drawn on the reticle, and wherein the image obtaining unit obtains image data of a pattern formed on the reticle in units of predetermined pixels.

6. The reticle inspecting apparatus according to claim 5, wherein the defect detecting unit detects a defect of the reticle by using a CCD camera.

7. The reticle inspecting apparatus according to claim 5, wherein the plurality of position accuracy measuring patterns are placed in each of areas formed by dividing a drawing area of the reticle.

8. The reticle inspecting apparatus according to claim 5, wherein the position of each position accuracy measuring pattern, which is cross-shaped, is obtained based on a result obtained by measuring the position of an end portion of the position accuracy measuring pattern.

9. A reticle inspecting apparatus comprising:
   an inspection data capturing unit configured to capture inspection data generated based on design data of a reticle;
   a measurement result capturing unit configured to capture position accuracy measurement data of a drawing position of the reticle;
   an inspection data correcting unit configured to correct the inspection data based on the position accuracy measurement data;
   an image obtaining unit configured to obtain image data of a pattern formed on the reticle; and
   a defect detecting unit configured to detect a defect of the reticle based on the corrected inspection data and the image data,
   wherein the inspection data correcting unit captures environment component correcting data that depends on the environment of the reticle inspecting apparatus from the image obtaining unit and further corrects the inspection data based on the environment component correcting data.

10. The reticle inspecting apparatus comprising:
    an inspection data capturing unit configured to capture inspection data generated based on design data of reticle;
    a measurement result capturing unit configured to capture position accuracy measurement data of a drawing position of the reticle;

an inspection data correcting unit configured to correct the inspection data based on the position accuracy measurement data;

an image obtaining unit configured to obtain image data of a pattern formed on the reticle; and a defect detecting unit configured to detect a defect of the reticle based on the corrected inspection data and the image data, wherein the position accuracy measurement data of the drawing position of the reticle captured by the measurement result capturing unit is based on a result obtained by measuring the drawing positions of a plurality of position accuracy measuring patterns drawn on the reticle, and wherein the image obtaining unit obtains image data of a pattern formed on the reticle in units of predetermined pixels, wherein the inspection data correcting unit captures environment component correcting data that depends on the environment of the reticle inspecting apparatus from the image obtaining unit and further corrects the inspection data based on the environment component correcting data.

11. A reticle inspecting method performed by a reticle inspecting apparatus having an inspection data correcting unit configured to correct the inspection data based on a position accuracy measurement data, and a defect detecting unit configured to detect a defect of the reticle by comparing the corrected inspected inspection data with image data, the method comprising the steps of:

capturing inspection data on the inspection data correcting unit to inspect a reticle;

obtaining a first correction amount to correct a position accuracy component of the reticle by capturing drawing position accuracy measurement data of the reticle;

correcting the inspection data based on the first correction amount; and detecting a defect on the reticle based on the corrected inspection data by the defect detecting unit.

12. The reticle inspecting method according to claim 11, further comprising the steps of:

obtaining a second correction amount to correct an environment component that depends on the environment of inspecting the reticle; and further correcting the inspection data based on the second correction amount.

13. The reticle inspecting method according to claim 11, further comprising the step of:

combining the corrected inspection data and the drawing position accuracy measurement data in order to generate corrected inspection data.

14. The reticle inspecting method according to claim 11, further comprising the steps of:

obtaining an image of a pattern formed on the reticle; and converting the corrected inspection data to a reference image, wherein, in the defect detecting step, a defect on the reticle is detected by comparing the pattern image with the reference image.

15. The reticle inspecting method according to claim 11, wherein the position accuracy (coordinate resolution) of the position accuracy measurement data is higher than at least that of the inspection data.

16. A reticle inspecting method performed by a reticle inspecting apparatus having an inspection data correcting unit configured to correct the inspection data based on a position accuracy measurement data, and a defect detecting unit configured to detect a defect of the reticle by comparing the corrected inspected inspection data with image data, the method comprising the steps of:

capturing inspection data on the inspection data correcting unit to inspect a reticle;

obtaining a first correction amount to correct a position accuracy component of the reticle by capturing drawing position accuracy measurement data of the reticle, the data being based on a result obtained by measuring the drawing positions of a plurality of position accuracy measuring patterns drawn on the reticle;

correcting the inspection data based on the first correction amount;

obtaining image data of a pattern formed on the reticle in units of predetermined pixels; and detecting a defect of the pattern formed on the reticle by comparing the corrected inspection data with the image data by the defect detecting unit.

17. The reticle inspecting method according to claim 16, further comprising the steps of:

obtaining a second correction amount to correct an environment component that depends on the environment of inspecting the reticle; and further correcting the inspection data based on the second correction amount.

18. The reticle inspecting method according to claim 16, wherein, in the step of obtaining image data of a pattern formed on the reticle in units of predetermined pixels, the image data is obtained by using a CCD camera.

19. The reticle inspecting method according to claim 16, wherein the plurality of position accuracy measuring patterns are placed in each of areas formed by dividing a drawing area of the reticle.

20. The reticle inspecting method according to claim 16, wherein the position of each position accuracy measuring pattern, which is cross-shaped, is obtained based on a result obtained by measuring the position of an end portion of the position accuracy measuring pattern.

* * * * *